United States Patent
Kimura et al.

(10) Patent No.: US 8,072,387 B2
(45) Date of Patent: Dec. 6, 2011

(54) MAGNETIC ANTENNA AND BOARD MOUNTED WITH THE SAME

(75) Inventors: Tetsuya Kimura, Otake (JP); Tomohiro Dote, Otake (JP); Yoshiro Sato, Tokyo (JP)

(73) Assignee: Toda Kogyo Corporation, Hiroshima-shi, Hiroshima-ken (JP)

(*) Notice: Subject to any disclaimer, the term of this patent is extended or adjusted under 35 U.S.C. 154(b) by 752 days.

(21) Appl. No.: 12/003,951

(22) Filed: Jan. 3, 2008

(65) Prior Publication Data

US 2008/0129629 A1 Jun. 5, 2008

Related U.S. Application Data

(63) Continuation-in-part of application No. PCT/JP2006/313495, filed on Jul. 6, 2006.

(30) Foreign Application Priority Data

Jul. 7, 2005 (JP) ................. 2005-199451
Jul. 14, 2005 (JP) ................. 2005-206254
Jan. 10, 2007 (JP) ................. 2007-002759

(51) Int. Cl.
*H01Q 7/08* (2006.01)
(52) U.S. Cl. ........................................ 343/788
(58) Field of Classification Search .......... 343/787–788, 343/742, 802, 867, 872
See application file for complete search history.

(56) References Cited

U.S. PATENT DOCUMENTS

| | | | |
|---|---|---|---|
| 4,879,570 A * | 11/1989 | Takizawa et al. | 343/713 |
| 4,978,966 A * | 12/1990 | Takizawa et al. | 343/788 |
| 5,870,065 A * | 2/1999 | Kanba et al. | 343/895 |
| 6,930,646 B2 * | 8/2005 | Yahata et al. | 343/718 |
| 2004/0013343 A1 | 1/2004 | Hoshikawa et al. | |
| 2009/0066466 A1 | 3/2009 | Arimura | |

FOREIGN PATENT DOCUMENTS

| | | |
|---|---|---|
| JP | 57-132083 | 8/1982 |
| JP | 01-194502 | 8/1989 |
| JP | 06-112655 | 4/1994 |
| JP | 11-205025 | 7/1999 |

(Continued)

OTHER PUBLICATIONS

English translation of Official Action in JP 2005-206254 dated Aug. 10, 2010.

(Continued)

*Primary Examiner* — Huedung Mancuso
(74) *Attorney, Agent, or Firm* — Nixon & Vanderhye P.C.

(57) ABSTRACT

There is provided a magnetic antenna, suitable for use in an RFID tag and an RFID tag reader/writer, which operates stable even if brought close to a metallic object and suitable for mass-production, and a board mounted with the magnetic antenna. The magnetic antenna has a coil comprising a magnetic layer and a conductive layer provided on the magnetic layer via an insulating layer. Alternatively, the magnetic antenna has a plurality of coils each comprising a magnetic layer having a square or rectangular shape and arranged radially. One ends of the coils are connected in series or parallel to one another by the magnetic layers thereof such that the coils have the same polarity. An insulating layer is provided on one or both outer surface of the coils, and a conductive layer is provided on an outer surface of at least one of the insulating layers. The magnetic antenna is produced using an LTCC technology.

24 Claims, 12 Drawing Sheets

FOREIGN PATENT DOCUMENTS

| | | | |
|---|---|---|---|
| JP | 11-297520 | | 10/1999 |
| JP | 11-353561 | | 12/1999 |
| JP | 2001-119224 | | 4/2001 |
| JP | 2002-204121 | | 7/2002 |
| JP | 2003-046321 | * | 2/2003 |
| JP | 2003-059722 | | 2/2003 |
| JP | 2003-152416 | | 5/2003 |
| JP | 2003-218626 | | 7/2003 |
| JP | 2004-200829 | | 7/2004 |
| JP | 2005-184094 | | 7/2005 |
| JP | 2005-192044 | | 7/2005 |
| JP | 2005-192124 | | 7/2005 |
| JP | 2006-041986 | | 2/2006 |
| WO | 2002/089157 | | 11/2002 |

OTHER PUBLICATIONS

International Search Report dated Aug. 22, 2006.

* cited by examiner

MAGNETIC ANTENNA AND BOARD MOUNTED WITH THE SAME

This application is a Continuation-in-Part of International Application No. PCT/JP2006/313495 filed 6 Jul. 2006 which designated the U.S. and claims priority to JP 2005-199451 filed 7 Jul. 2005, JP 2005-206254 filed 14 Jul. 2005; and JP 2007-002759 filed 10 Jan. 2007, the entire contents of each of which are hereby incorporated by reference.

TECHNICAL FIELD

The present invention relates to a magnetic antenna, and more particularly, to a magnetic antenna for communication using a magnetic field component, which is capable of transmitting and receiving a signal with high sensitivity even when attached to a metal object, and a board mounted with the magnetic antenna. The magnetic antenna of the present invention is particularly suited for use in an RFID tag and an RFID tag reader/writer.

BACKGROUND ART

An antenna for transmitting and receiving an electromagnetic wave using a magnetic material (hereinafter referred to merely as "magnetic antenna"), in which a magnetic field component coming from the outside is allowed to pass through the magnetic material, around which a coil of a conductive wire is wound, to convert the magnetic field component into a voltage (or current) induced by the coil, has been widely used in small-sized radios and TVs. Such a magnetic antenna is also used in a non-contact object identification device called RFID tag which has recently come into use.

To transmit and receive an electromagnetic wave with a higher frequency, a loop antenna free of a magnetic material and including a loop coil having a coil surface parallel to an object to be identified is used in RFID tags. When the frequency is much higher (UHF band or microwave band), an electric field antenna (dipole antenna or dielectric antenna) for detecting an electric field component instead of a magnetic field component is widely used in such devices including RFID tags.

However, such loop antenna and electric field antenna have the following problem. When such an antenna is brought close to a metallic object, an image (mirror effect) is generated on the metallic object. Since the magnetic field of the image has a phase opposite to that of the antenna or since the electric field drops to zero on the metal surface, the sensitivity of the antenna is lost. To overcome the problem, there has been developed a magnetic antenna including a coil having a coil surface with a square or rectangular shape as viewed in a plan view and to be directly attached to a metallic object to be identified such that a cross-section of the coil is perpendicular to a metal surface of the object (Japanese Patent Application Laid-open (KOKAI) No. 2003-317052). Also, a non-contact sensor coil has been proposed in which a metal surface to which a magnetic antenna is attached is positively used to arrange coils in order to cancel a magnetic field parallel to the metal surface and to generate a magnetic field in a direction perpendicular to the metal surface (Japanese Patent Application Laid-open (KOKAI) No. 2003-318634).

DISCLOSURE OF THE INVENTION

Problem to be Solved by the Invention

The above magnetic antenna for use in an RFID tag, however, has the problem that when the wound coil is brought into contact with a metallic object, the contact surfaces between the wound wire and the metal plate become unstable to cause variations in characteristics of the antenna. Also, since an antenna of the above type has open opposite ends, magnetic fields are generated at both ends of the coil and the separate two poles must be used for transmission and reception, respectively, in spite of the fact that a magnetic antenna for an RFID tag reader/writer having a pole with which both transmission and reception can be achieved is required. Although a magnetic antenna which can overcome the problem has been developed, the magnetic antenna has variations in characteristics when its coil of a wound enamel wire or the like is brought into contact with a metallic object as described above.

In any of an RFID tag and a reader/writer, an antenna applied thereto which has a coil of a wound wire is not suitable for mass-production. In addition, conventional magnetic antennas undergo changes in characteristics when brought close to a metallic object and their resonant frequencies are changed. To achieve resonance with a target frequency, the magnetic antennas need to be attached to a metal plate to adjust their frequencies individually.

The present invention has been made in view of the above problems, and it is, therefore, an object of the present invention to provide a magnetic antenna, suitable for use in an RFID tag and an RFID tag reader/writer, which does not vary in characteristics even when its coil is brought into contact with a metallic object and which is suitable for mass-production. Another object is to provide a magnetic antenna whose resonant frequency is not changed even when it is brought close to a metallic object. A further object of the present invention is to provide a magnetic antenna, suitable for use in an RFID tag reader/writer, which includes a coil having a pole with which both transmission and reception can be achieved precisely.

Means for Solving the Problem

The present invention has solved the above problems by adopting a structure having a coil including a magnetic layer and an electrode material formed in a spiral configuration around the magnetic layer; and a conductive layer formed on the coil via an insulating layer.

The present invention suitable for use in an RFID tag includes the following first to third aspects. In the first aspect of the present invention, there is provided a magnetic antenna for transmitting and receiving a magnetic field component, comprising: a coil comprising a magnetic layer and an electrode material formed in a spiral configuration around the magnetic layer; an insulating layer provided on one or both outer surfaces of the coil; and a conductive layer provided on an outer surface of at least one of the insulating layers.

In the second aspect of the present invention, there is provided a magnetic antenna for transmitting and receiving a magnetic field component, which is produced by a method comprising: providing a single- or multi-layered magnetic layer comprising a molded sheet or sheets of a mixture of a magnetic powder and a binder resin; forming an electrode material in a spiral configuration around the magnetic layer as an electric circuit to obtain a coil; forming an insulating layer on each of both outer surfaces of the coil; forming a conductive layer on an outer surface of at least one of the insulating layers to obtain a laminate; cutting the laminate into a predetermined size; and calcining the cut laminate into a unitary body.

In the third aspect of the present invention, there is provided a magnetic antenna for transmitting and receiving a magnetic field component, which is produced by a method comprising: providing a single- or multi-layered magnetic layer comprising a square or rectangular molded sheet or sheets of a mixture of a magnetic powder and a binder resin; forming through-holes in the magnetic layer; filling the through-holes with an electrode material; forming an electrode layer of an electrode material on each of outer surfaces of the magnetic layer perpendicular to the through-holes such that the electrode layers are connected to the through-holes to form coils and that opposite ends of the magnetic layer conform to open ends of a magnetic circuit; forming an insulating layer on each of both outer surfaces of the coils having the electrode layers; forming a conductive layer on an outer surface of at least one of the insulating layers to obtain a laminate; cutting the laminate along lines passing the through-holes and along lines corresponding to the open ends of the coils; and calcining the cut laminate into a unitary body.

The present invention suitable for use in an RFID tag reader/writer includes the following fourth to seventh aspects. In the fourth aspect of the present invention, there is provided a magnetic antenna for transmitting and receiving a magnetic field component, comprising: a plurality of coils each comprising a magnetic layer having a square or rectangular planar shape and arranged radially at generally angularly equal intervals as viewed in a plan view with their one ends connected in series or parallel to one another at the center of the radial pattern by the magnetic layers thereof such that the coils have the same polarity, the plurality of coils extending radially outward and opening in a magnetic circuit at the other ends; an insulating layer provided on one or both outer surfaces of the coils; and a conductive layer provided on an outer surface of at least one of the insulating layers.

In the fifth aspect of the present invention, there is provided a magnetic antenna for transmitting and receiving a magnetic field component, comprising: a plurality of coils each comprising a magnetic layer having a square or rectangular planar shape, arranged radially at generally angularly equal intervals as viewed in a plan view, and extending radially inward and opening in a magnetic circuit at their one ends, the plurality of coils having the other ends directed radially outward and connected in series or parallel to one another by an annular magnetic layer such that the coils have the same polarity; an insulating layer provided on one or both outer surfaces of the coils; and a conductive layer provided on an outer surface of at least one of the insulating layers.

In the sixth aspect of the present invention, there is provided a magnetic antenna produced using an LTCC technology for transmitting and receiving a magnetic field component, comprising: a plurality of coils each comprising a magnetic layer having a square or rectangular planar shape, arranged radially at generally angularly equal intervals as viewed in a plan view with their one ends connected in series or parallel to one another at the center of the radial pattern by the magnetic layers thereof such that the coils have the same polarity, the plurality of coils extending radially outward and opening in a magnetic circuit at the other ends, and obtainable by a method comprising: providing a single- or multi-layered magnetic layer comprising a square or rectangular molded sheet or sheets of a mixture of a magnetic powder and a binder resin; forming through-holes in the magnetic layer; filling the through-holes with an electrode material; forming an electrode layer of an electrode material on each of surfaces of the magnetic layer perpendicular to the through-holes; punching the magnetic layer and the electrode layers along lines passing the centers of the through-holes to form coil assemblies each having three coils arranged radially with their one ends connected to one another; providing an insulating layer punched into a shape adapted to cover the electrode layer on the upper surface of the magnetic layer on an upper surface of the magnetic layer including the coils and forming another insulating layer on a lower surface of the magnetic layer; forming a conductive layer of the same material as the electrode material on a lower surface of the other insulating layer on the lower surface of the magnetic layer to obtain a laminate; and cutting the laminate into individual pieces of coil assemblies and calcining each piece of coil assembly into a unitary body or calcining the laminate into a unitary body and cutting the calcined laminate into individual pieces of coil assemblies.

In the seventh aspect of the present invention, there is provided a magnetic antenna for transmitting and receiving a magnetic field component comprising: a plurality of coils each comprising a magnetic layer having a square or rectangular planar shape, arranged radially at generally angularly equal intervals as viewed in a plan view, and extending radially inward and opening in a magnetic circuit at their one ends, the plurality of coils having the other ends directed radially outward and connected to one another by an annular magnetic layer such that the coils have the same polarity; and obtainable by a method comprising: providing a single- or multi-layered magnetic layer comprising a square or rectangular molded sheet or sheets of a mixture of a magnetic powder and a binder resin; forming through-holes in the magnetic layer; filling the through-holes with an electrode material; forming an electrode layer of an electrode material on each of surfaces of the magnetic layer perpendicular to the through-holes; punching the magnetic layer and the electrode layers along lines passing the centers of the through-holes to form coil assemblies; providing an insulating layer punched into a shape adapted to cover the electrode layer on the upper surface of the magnetic layer on an upper surface of the magnetic layer including the coils and forming an another insulating layer on a lower surface of the magnetic layer; forming a conductive layer of the same material as the electrode material on a lower surface of the other insulating layer on the lower surface of the magnetic layer to obtain a laminate; and cutting the laminate into individual pieces of coil assemblies and calcining each piece of coil assemblies into a unitary body.

In the eighth aspect of the present invention, there is provided a board mounted with the magnetic antenna as defined in any one of the above aspects 1 to 7.

EFFECT OF THE INVENTION

According to a magnetic antenna of the present invention, since a conductive layer is provided by an LTCC technology, the laminated layers can be closely bonded to each other and the coil and the conductive layer can be stably joined together. In addition, it is not required to adjust a frequency of the magnetic antenna under environmental conditions upon use, and the frequency can be adjusted independently. Moreover, since the conductive layer is provided, the antenna does not undergo a change in characteristics even when brought close to a metallic object. Further, since a plurality of elements can be stably produced from one sheet, a large number of elements can be produced with little variation and at low production costs.

In particular, since the magnetic antenna according to the first to third aspects of the present invention undergoes as small a change in resonant frequency as 1 MHz or less when attached to a metal surface, it can be used in a wide frequency from 125 KHz to 2.45 GHz. For example, when the magnetic antenna is used in a 13.56 MHz RFID tag, a communication distance of 3 cm or greater can be achieved even when the tag is adhered to a metal surface. Also, when the antenna has a symmetrical green sheet laminated structure with respect to the coil at the center, a warpage of 0.5 mm or less per 1 cm length along the long side thereof after firing can be achieved. Therefore, the antenna is suitable for practical use.

In addition, since the magnetic antenna according to the fourth to seventh aspects of the present invention has a magnetic layer on the outside of the conductive layer, the change in characteristics at a time when adhered to a metallic object can be further decreased. The magnetic antenna of the present invention can be used in an RFID tag as well as an RFID tag reader/writer, and can be used in a wide frequency range from 125 kHz to 2.45 GHz when the magnetic layer for the coil is properly selected.

EXPLANATION OF REFERENCE NUMERALS

Figure 1:
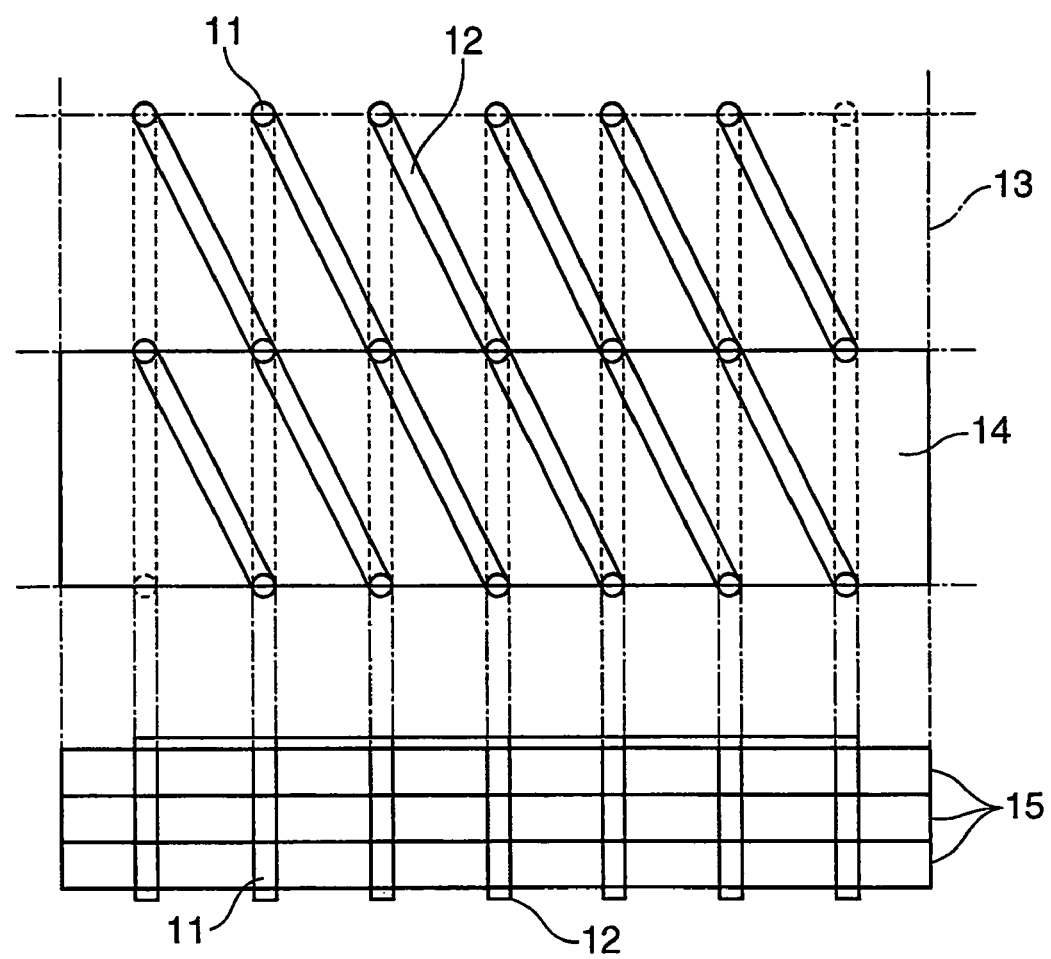
FIG. 1 is a perspective view illustrating the layer structure of a coil of a magnetic antenna according to first to third aspects of the present invention.

11: through-hole
12: electrode layer
13: coil open end
14: coil
15: magnetic layer
16: insulating layer
17: conductive layer
18: IC chip connecting terminal
19: coil lead terminal
1R: FM radio
1C: capacitor electrode
21: magnetic layer of coil portion
22: coil electrode
23: insulating layer
24: conductive layer
25: magnetic layer
26: coil electrode formed of cross-section of through-hole
27: direction of magnetic field lines
28: capacitor
29: coil lead terminal
31: board
32: magnetic antenna
33: board connecting terminals
34: board wirings

PREFERRED EMBODIMENTS FOR CARRYING OUT THE INVENTION

Embodiments of a magnetic antenna suitable for use in an RFID tag according to first to third aspects of the present invention will be first described with reference to FIG. 1 to FIG. 7.

Figure 2:
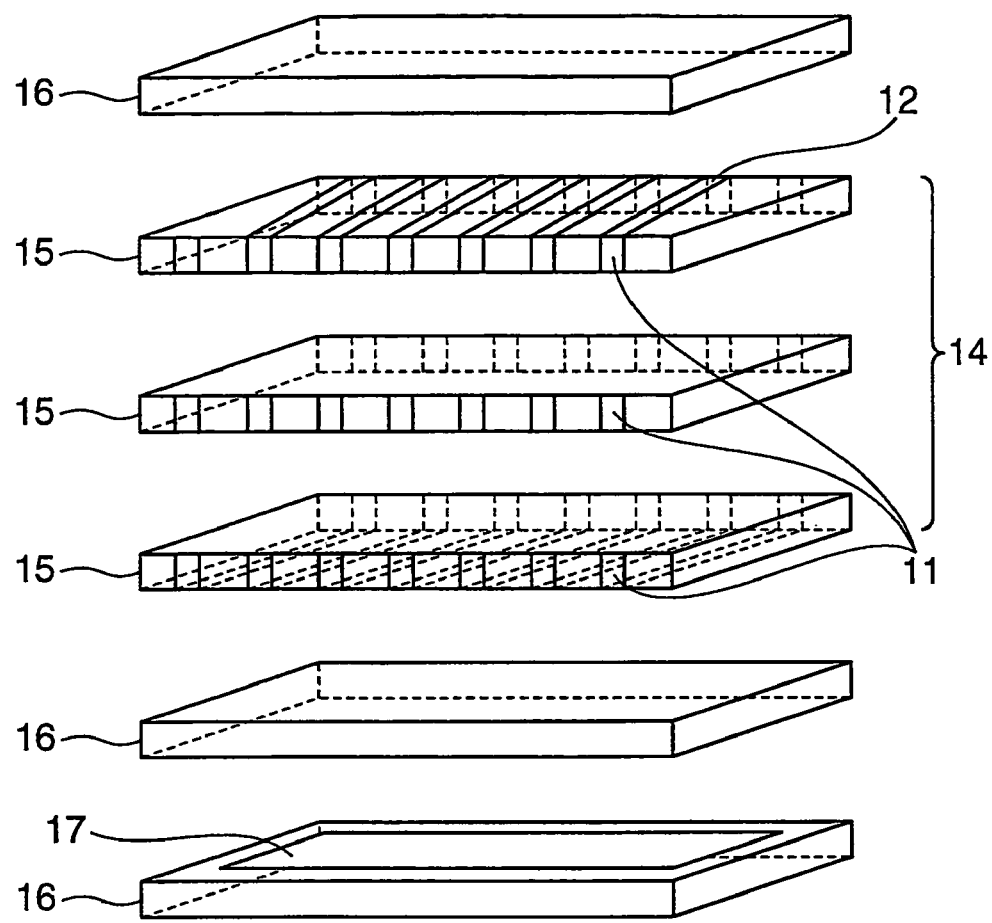
FIG. 2 is a perspective view illustrating a magnetic antenna of Example 1 according to the first to third aspects of the present invention.

The magnetic antenna of the present invention generally has a coil 14 as shown in FIG. 1 and insulating layers 16 sandwiching the coil 14 from both upper and lower surfaces thereof as shown in FIG. 2. In the magnetic antennas of the present invention, a magnetic layer 15 having a square or rectangular planar shape as shown in FIG. 1 is used to form coils 14. The magnetic layer 15 has a single- or multi-layer structure, and each layer comprises a molded sheet of a mixture of a magnetic powder and a binder. Through-holes 11 are formed in the magnetic layer 15 and filled with an electrode material. Electrode layers 12 of an electrode material are formed on the surfaces of the magnetic layer 15 perpendicular to the through-holes 11 such that the electrode layers 12 are connected to the through-holes 11 to form coils and that opposite ends of the magnetic layer conform to open ends of a magnetic circuit.

Then, the coils 14 having the magnetic layer and the electrode layers 12 printed thereon are sandwiched between insulating layers 16 as shown in FIG. 2, and a conductive layer 17 is formed on an upper surface of at least one of the insulating layers 16. The resulting laminate including the coils 14, insulating layers 16 and at least one conductive layer 17 is cut along lines passing the through-holes 11 and along coil open ends 13, and each cut laminate is calcined into a unitary body. In the present invention, an LTCC (Low Temperature Co-fired Ceramics) technology is used as described above to improve the mass productivity.

Figure 3:
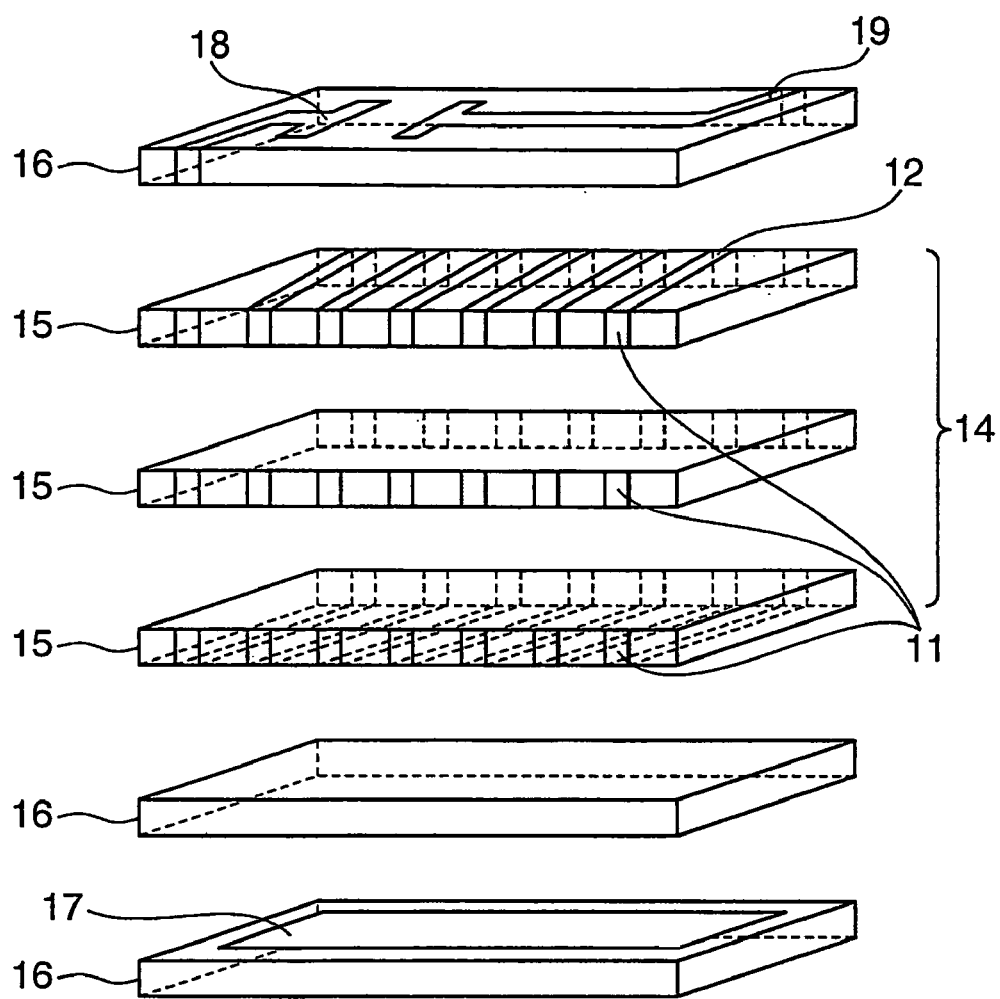
FIG. 3 is a perspective view illustrating a magnetic antenna of Example 2 according to the first to third aspects of the present invention.

A coil lead terminal 19 and an IC chip connecting terminal 18 may be formed on the magnetic antenna of the present invention as shown in FIG. 3. Through-holes 11 are formed through one or both of the insulating layers 16 provided over the coils 14 having the electrode layers 12 printed thereon, and filled with an electrode material so that the electrode material filled in the through-holes 11 connected to opposite ends of the coil 14. A coil lead terminal 19 and an IC chip connecting terminal 18 are printed on the insulating layer 16 or layers with an electrode material. The resulting laminate including the coils 14, insulating layers 16 and at least one conductive layer 17 is calcined into a unitary body.

Figure 4:
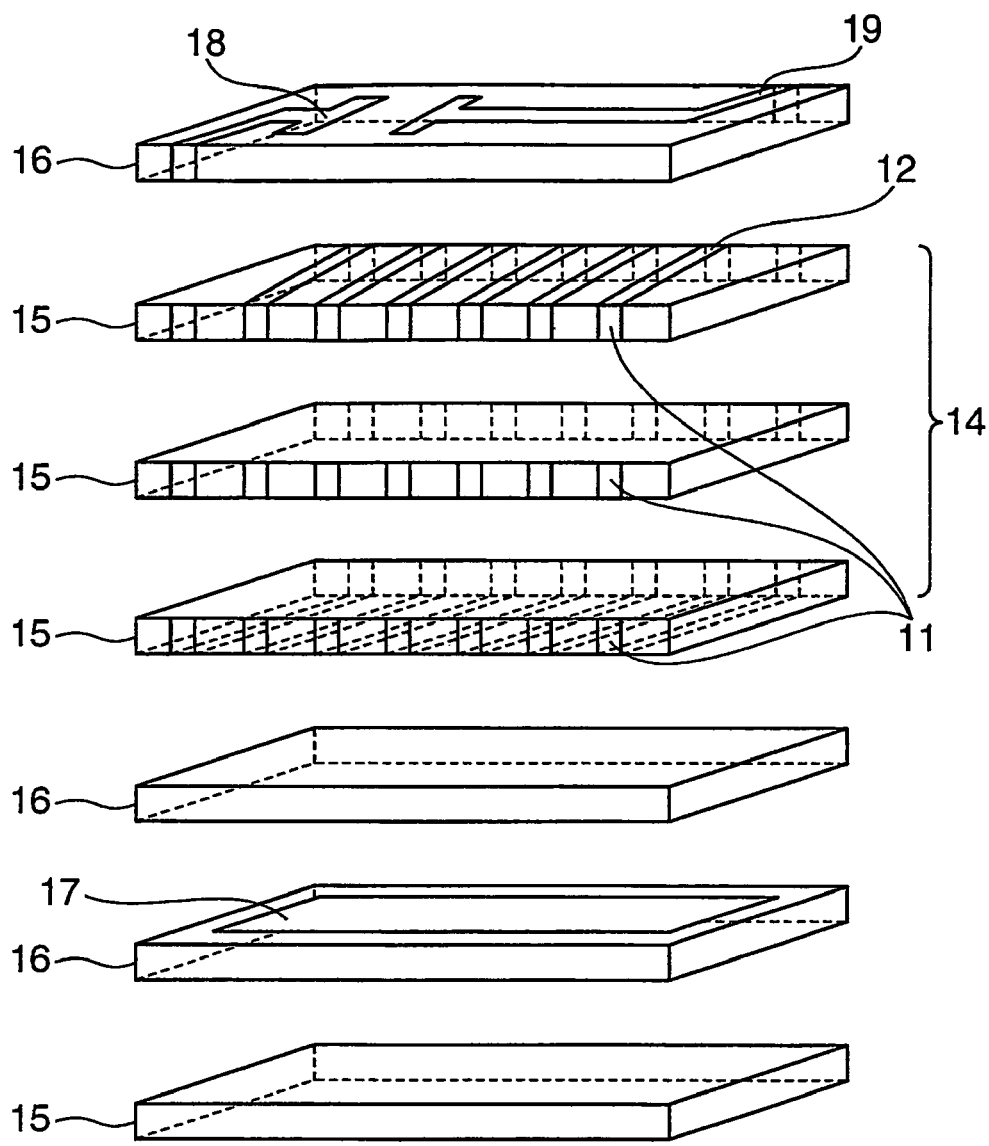
FIG. 4 is a perspective view illustrating a magnetic antenna of Example 3 according to the first to third aspects of the present invention.

The magnetic antenna of the present invention may have an additional magnetic layer 15 provided on the lower surface of the insulating layer 16 having a conductive layer 17 thereon as shown in FIG. 4. In this case, the magnetic antenna of the present invention undergoes only slight changes in characteristics and in resonant frequency even when brought close to a metallic object. The magnetic antenna of the present invention may have an additional magnetic layer 15 provided on the lower surface of the insulating layer 16 having a conductive layer 17 thereon and an additional insulating layer 16 provided on the lower surface of the additional magnetic layer as shown FIG. 5. In this case, the stresses between the layers can be balanced in the magnetic antenna of the present invention, and warpage of the magnetic antenna can be reduced.

Figure 6:
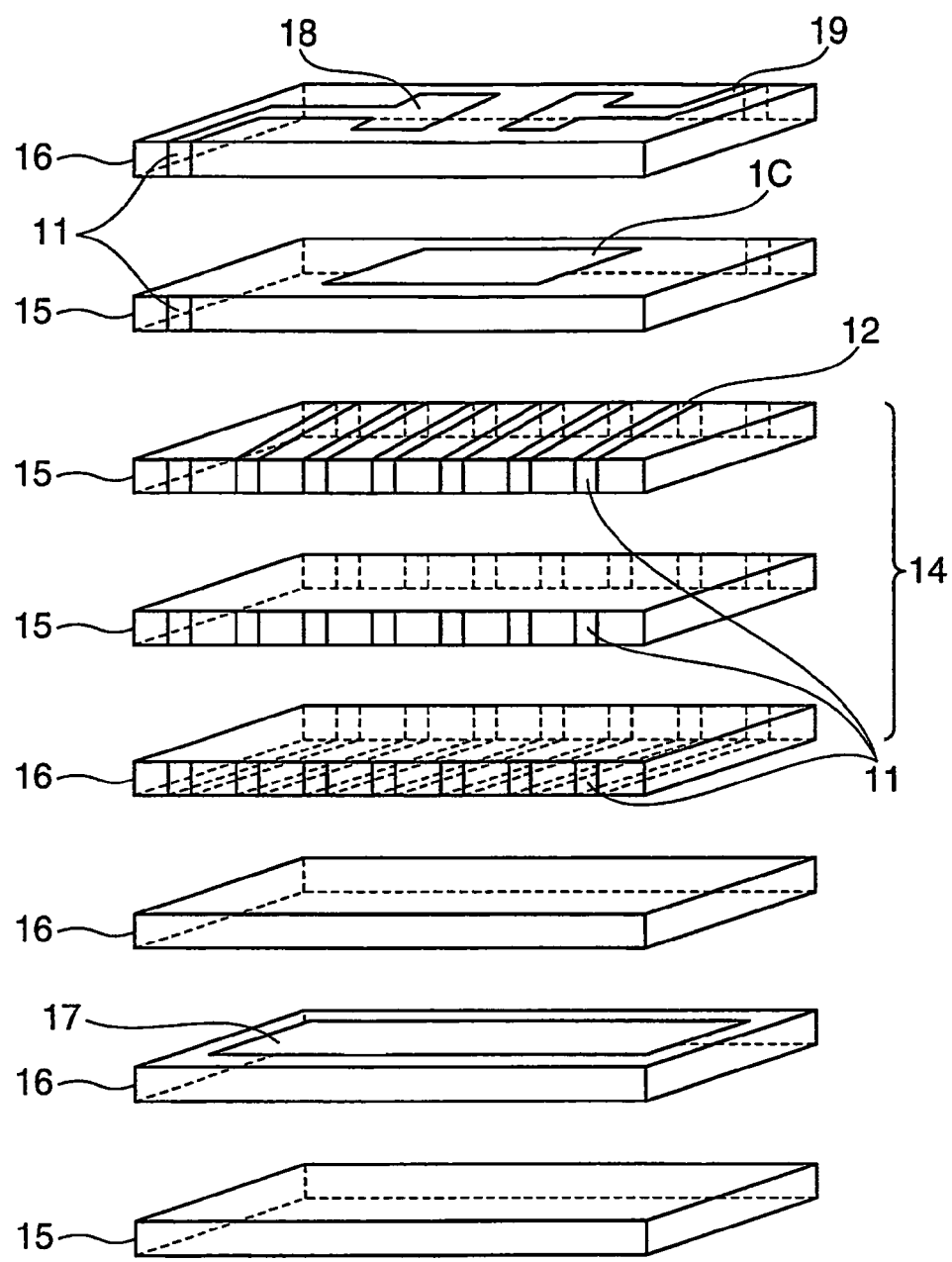
FIG. 6 is a perspective view illustrating a magnetic antenna of Example 5 according to the first to third aspects of the present invention.

The magnetic antenna of the present invention may have a capacitor electrode 1C as shown in FIG. 6. A capacitor electrode 1C is provided on one or both of the insulating layers between which the coil is sandwiched. An additional insulating layer 16 having an electrode printed on an outer surface thereof is provided on an outer surface of the insulating layers having the capacitor electrode 1C so that a capacitor can be formed between the electrodes. The coil 14 is connected in parallel or series to the IC chip connecting terminal 18 and the coil lead terminal 19.

In the magnetic antenna of the present invention, a parallel electrode or interdigital electrode may be printed on the upper surface of the insulating layer to form a capacitor, and the coil 14 may be connected in parallel or series to the coil lead terminal. The capacitor may have a parallel plate structure with an insulating layer 16 sandwiched between electrodes or a planar structure with an interdigital or parallel electrode. When the capacitor has a parallel plate structure, one of the capacitor electrodes may serve as an IC chip connecting terminal 18 as shown in FIG. 6.

The magnetic antenna of the present invention has a magnetic layer 15 comprising an Ni—Zn based ferrite magnetic material and is produced by calcination. The ferrite powder preferably has a composition of 45 to 49.5 mol % of $Fe_2O_3$, 9.0 to 45.0 mol % of NiO, 0.5 to 35.0 mol % of ZnO and 4.5 to 15.0 mol % of CuO. The composition is suitably selected such that the resulting magnetic layer will have a high magnetic permeability and a low magnetic loss in the frequency band in which it is intended to operate. When the magnetic permeability is too low, the number of turns of the coil will be so large that the antenna will be difficult to produce by an LTCC technology. When the magnetic permeability is too high, the loss will be so large that the magnetic layer will be unsuitable for an antenna. For example, the composition of the ferrite is preferably selected such that the magnetic layer will have a magnetic permeability of 70 to 120 at 13.56 MHz when the antenna is applied to an RFID tag, and have a magnetic permeability of 10 to 30 at 100 MHz when the antenna is used to receive commercial FM broadcasts. The ferrite is calcined at a temperature of 800 to 1000° C. and preferably 850 to 920° C.

A Zn based ferrite is used for the insulating layers 16. It is preferred to select a Zn based ferrite powder having such a composition that a sintered body formed therefrom has a volume resistivity of $10^8$ Ωcm or higher. That is, the Zn based ferrite preferably has a composition of 45 to 49.5 mol % of $Fe_2O_3$, 17.0 to 22.0 mol % of ZnO, and 4.5 to 15.0 mol % of CuO. A glass based ceramic may be also used for the insulating layers 16. As the glass based ceramic, a borosilicate glass, a zinc glass, a lead glass or the like can be used.

In the magnetic antenna of the present invention, a total thickness of the magnetic layers 15 which serve as a core of the coil is preferably 0.1 to 3.0 mm, while one of the insulating layers 16 preferably has a thickness of 0.01 to 0.2 mm. Further, in the magnetic antenna of the present invention, the ratio of the thickness of the magnetic layers 15 serving as a core of the coil to the thickness of one of the insulating layers 16 (magnetic layers/one insulating layer) is preferably 0.5 to 300.

Incidentally, in the magnetic antenna of the present invention, each of the magnetic layer 15 and the insulating layer 16 which are formed outside the coil composed of the magnetic layers and electrode layers preferably has a thickness of 0.05 to 0.5 mm.

The conductive layer may be formed by any known method but is preferably formed by an ordinary method such as printing or brushing.

As the material for the conductive layer and as the electrode material to be filled in the through-holes, an Ag paste is suitably used. Further, other metal containing conductive pastes such as an Ag alloy paste may also be used.

The conductive layer 17 outside the insulating layers 16 preferably has a thickness of 0.001 to 0.1 mm.

The magnetic antenna of the present invention may have a terminal to which an IC chip is connectable on the upper surface of one of the insulating layers 16 as shown in FIG. 3 and which may be connected in parallel or series to the IC chip connecting terminal 18 and be calcined into a unitary body. Also, a terminal to which a variable capacitor is connectable may be formed on the upper surface of the insulating layer and connected in parallel or series to the coil lead terminal. As the electrode material in the present invention, an Ag paste is suitable. Other metal based conductive pastes such as an Ag based alloy paste can be also used.

Next, embodiments of a magnetic antenna suitable for use in an RFID tag reader/writer according to fourth to seventh aspects of the present invention will be described with reference to FIG. 9 to FIG. 13.

Figure 9:
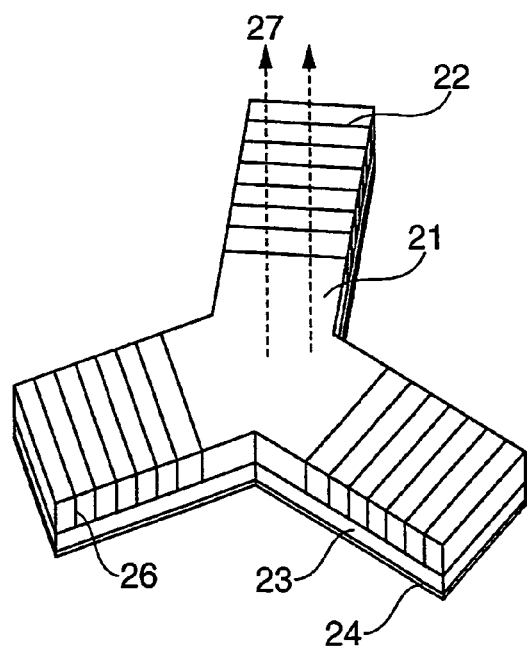
FIG. 9 is a perspective view illustrating a magnetic antenna of Example 7 according to fourth to seventh aspects of the present invention.

The magnetic antenna of the present invention is an antenna for transmitting and receiving a magnetic field component and has a plurality of coils each formed of a magnetic layer 21 having a square or rectangular planar shape as shown in FIG. 9. The coils are arranged radially at generally angularly equal intervals as viewed in a plan view. One ends of the coils are connected to one another at the center of the radial pattern by the magnetic layers thereof, and the coils extend radially outward and terminate (open in a magnetic circuit) at the other ends. The one ends of the coils are connected in series (see FIG. 11 and FIG. 12) or parallel (see FIG. 13) to each other such that the coils have the same polarity. An insulating layer 23 is provided on one or both outer surfaces of the coils as viewed in a plan view, and a conductive layer 24 is provided on the outside of at least one of the insulating layers 23.

Figure 10:
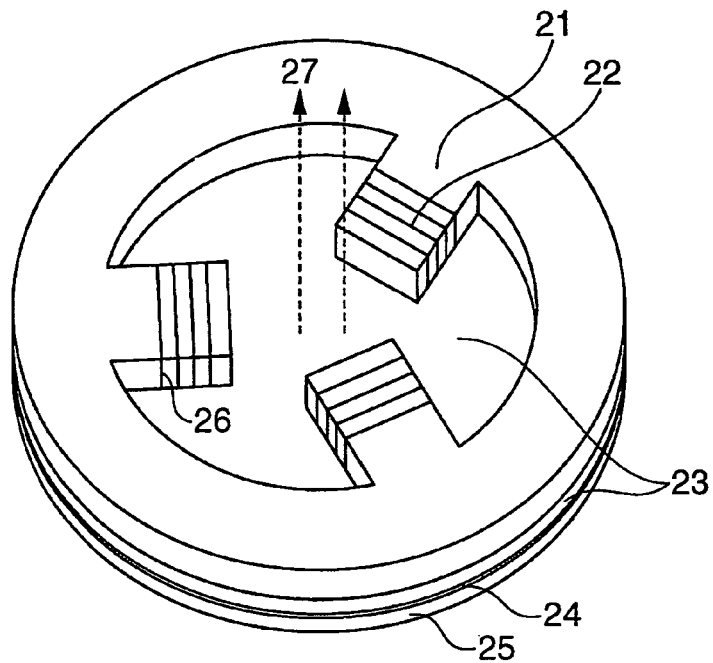
FIG. 10 is a perspective view illustrating a magnetic antenna of Example 8 according to the fourth to seventh aspects of the present invention.

Alternatively, the magnetic antenna of the present invention is a magnetic antenna for transmitting and receiving a magnetic field component and has a configuration as shown in FIG. 10. That is, the magnetic antenna has a plurality of coils each formed of a magnetic layer 21 having a square of rectangular planar shape. The coils are arranged radially at generally angularly equal intervals as viewed in a plan view, and extend radially inward and terminate at their one ends. The other ends of the coils are directed radially outward and connected in series or parallel to one another by an annular magnetic layer such that the coils have the same polarity. An insulating layer 23 is provided on one or both of the outer surfaces of the coils as viewed in a plan view, and a conductive layer 24 is provided on the outside of at least one of the insulating layers 23.

The above magnetic antenna is produced utilizing the LTCC technology. The magnetic layer 21 forming the coils has a single- or multi-layer structure, and each layer comprises a molded sheet of a mixture of a calcined magnetic powder and a binder. Through-holes are formed in the magnetic layer 21 and filled with an electrode material. Electrode layers of an electrode material are formed on both surfaces of the magnetic layer 21 perpendicular to the through-holes. The magnetic layer 21 including the electrode layers is punched along lines including lines passing the centers of the through-holes to form a coil structure. That is, coil electrodes 26 are formed by the cross-sections of the electrode material filled in the through-holes. At this time, the magnetic layer 21 is punched to form coil assemblies each having three coils arranged radially with their magnetic layers connected at the center of the radial pattern. The shaped magnetic layer 21 (coils) is sandwiched between insulating layers 23. The insulating layer 23 provided on the upper surface of the magnetic layer having an electrode layer printed thereon has been previously punched into a shape adapted to cover the electrode layer 24. A conductive layer 24 comprising the same material as the electrode material is provided on the lower surface of the insulating layer 23 on the lower surface of the magnetic layer 21. Then, the resulting laminate is cut into individual pieces of coil assemblies, and each piece of coil assembly is calcined into a unitary body.

The magnetic antenna produced as described above has a plurality of coils arranged radially and each having a magnetic layer 21 with a square or rectangular planar shape. One ends of the coils are connected by the magnetic layer 21, and the coils extend radially and terminate at the other ends. The coils are connected in series or parallel to one another such that all the coils have the same polarity. Since the coils facing one another have the same polarity, components of a magnetic field 27 parallel to a metal surface are cancelled (see FIG. 11), and only components perpendicular to the metal surface can be obtained (see FIG. 9 and FIG. 10).

In the magnetic antenna of the present invention, the insulating layers 23 on both sides of the coils having electrode layers 24 printed thereon or the insulating layer 23 opposite the one on which the conductive layer 24 has been formed may have through-holes filled with an electrode material, and a coil lead terminals 29 of an electrode material printed thereon and connected to the beginnings and ends of the coils. In addition, an additional magnetic layer 25 may be provided on the outside the conductive layer 24. When a magnetic layer 25 is provided on the outside of the conductive layer 24, the change in resonant frequency can be decreased when the magnetic antenna is attached to a metal surface as compared to a magnetic antenna without the magnetic layer 25. Moreover, the magnetic antenna of the present invention may have another insulating layer on the outside of the magnetic layer on the outside of the conductive layer 24. In this case, the stress between the layers in the laminate structure including the coils can be balanced, and warpage of the magnetic antenna can be reduced.

Figure 11:
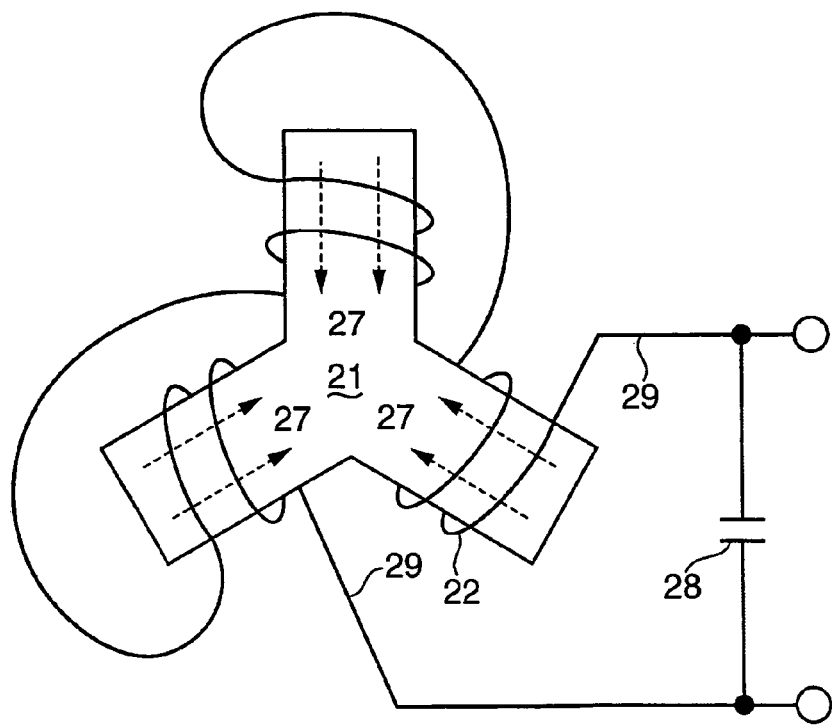
FIG. 11 is a circuit diagram schematically illustrating an example in which three coils are connected in series and a capacitor is connected in parallel between both ends thereof in the magnetic antenna shown in FIG. 9 or FIG. 10.
Figure 12:
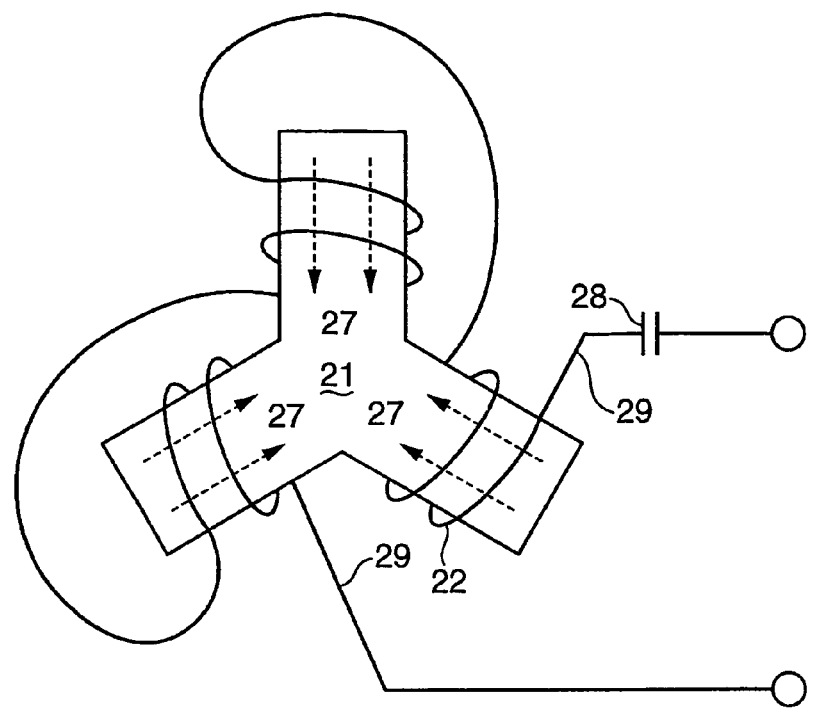
FIG. 12 is a circuit diagram schematically illustrating an example in which three coils are connected in series and a capacitor is connected in series to one end thereof in the magnetic antenna shown in FIG. 9 or FIG. 10.
Figure 13:
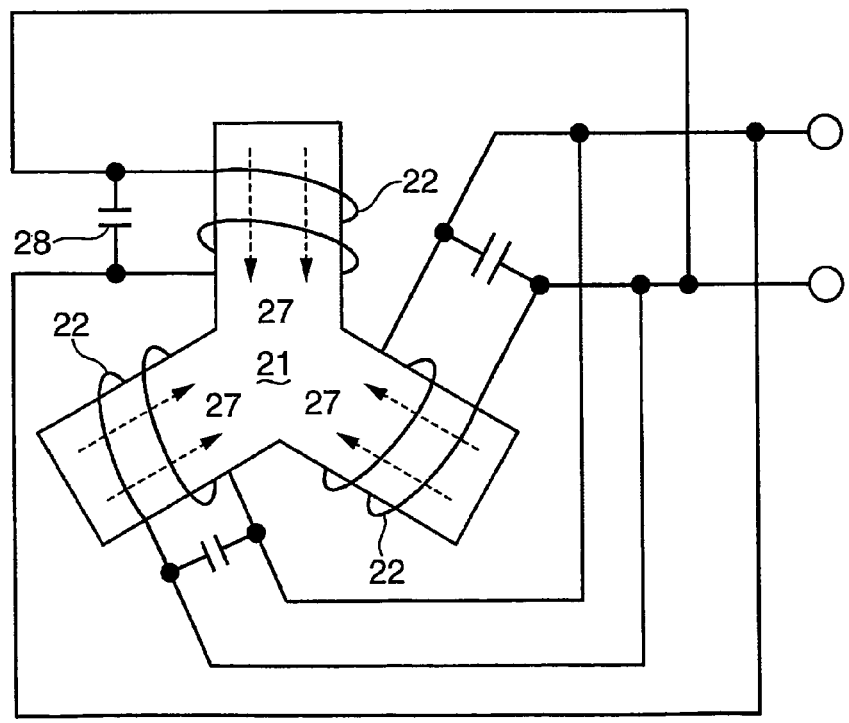
FIG. 13 is a circuit diagram schematically illustrating an example in which three coils are connected in parallel and a capacitor is connected in parallel between both ends of each coil in the magnetic antenna shown in FIG. 9 or FIG. 10.

The magnetic antenna of the present invention may have another insulating layer having square or circular electrodes printed on both sides thereof on said additional insulating layer provided on an upper surface of insulating layers 23 covering said coil to form a capacitor 28. The capacitor 28 is connected in parallel (see FIG. 11 and FIG. 13) or series (see FIG. 12) to the coil lead terminal electrodes 29 to form a circuit as shown in FIG. 11 to FIG. 13.

The magnetic antenna of the present invention may have a parallel electrode or an interdigital electrode printed on an upper surface of the insulating layer 23 on the upper surfaces of the coils to form a capacitor 28. The capacitor 28 is connected in parallel (see FIG. 11 and FIG. 13) or series (see FIG. 12) to the coil lead terminals 29 to form a circuit as shown in FIG. 11 to FIG. 13. A specific print pattern is shown in FIG. 6. The capacitor 28 may have a parallel plate structure having electrodes provided on both sides of an insulating layer 23 or a planar structure having an interdigital or a parallel electrode. When the capacitor 28 has a parallel plate structure, one of the capacitor electrode may serve as an IC chip connecting terminal.

The magnetic antenna of the present invention uses an Ni—Zn based ferrite magnetic material for the magnetic layer 21 as the magnetic antenna according to the first to third aspects mentioned above, and is produced by calcination. The composition of the ferrite powder and the ferrite calcination temperature are the same as those in the case of the magnetic antenna described above. The composition of the insulating layers 23 is also the same as in the case of the magnetic antenna described above. A glass based ceramic may be used for the insulating layers 23 as in the case of the magnetic antenna described above.

The magnetic antenna of the present invention may have a terminal to which an IC chip is connectable on the surface of insulating layer 23 and which is connected in parallel or series to the coil lead terminals 29 as in the case of the magnetic antenna described above. In addition, an Ag paste is suitable for the electrode material as in the case of the magnetic antenna described above. Other metal conductive pastes such as Ag based alloy paste can be also used.

Figure 14:
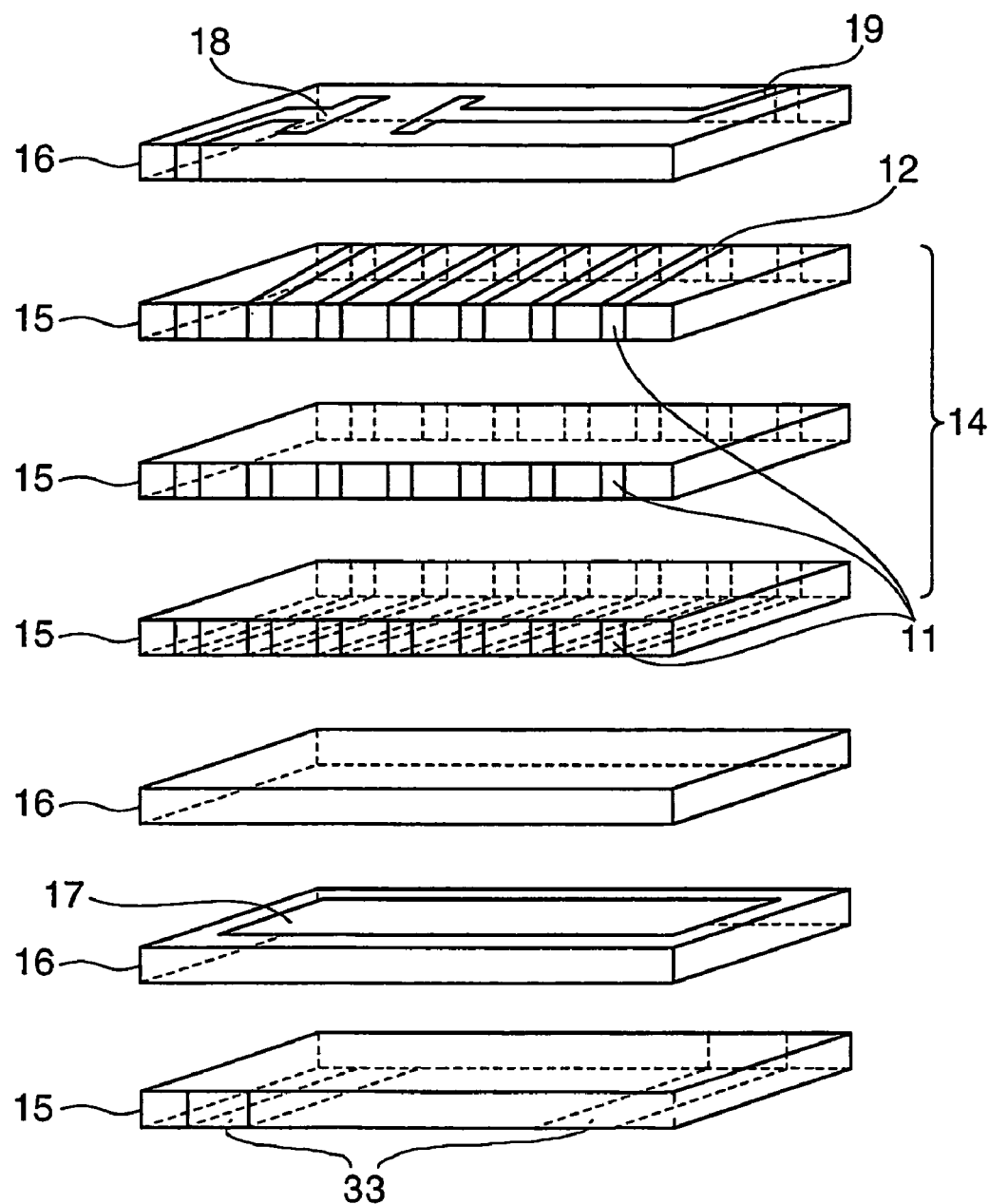
FIG. 14 is a perspective view illustrating a magnetic antenna of Example 10.

As shown in FIG. 14, the magnetic antenna of the present invention is obtainable by a method which comprises forming through-holes 11 in insulating layers 16, 16 and a magnetic layer 15, which are provided on a lower surface of the coils 14, then filling the through-holes with an electrode material so as to be in electrical contact with both ends of the coils 14, forming a board connecting terminals 33 on a lower surface of the magnetic layer 15, and calcining the resulting laminate into a unitary body.

The board used in the present invention may be formed of a ceramic, a resin, etc. Further, the board may be made of a composite material composed of the above materials or may contain a metal.

The board mounted with the magnetic antenna according to the present invention is characterized in that the magnetic antenna 32 is fixed to a surface of a board 31 by any suitable means such as an adhesive agent, a bonding agent or soldering. Since, in the present invention, the magnetic antenna can be mounted together with other electric parts on a multilayer wiring board by a generally employed method for mounting electric parts on multilayer wiring boards, a high mass production efficiency is obtainable.

A multilayer wiring board has buried wirings of a conductive material which have the same influence upon an antenna as that of metals. However, the board mounted with the magnetic antenna according to the present invention which has the above-described structure is not influenced by metal and, therefore, is not influenced by the board such as a multilayer wiring board having wirings made of a conductive material and provided within or on a surface of the board.

Figure 15:
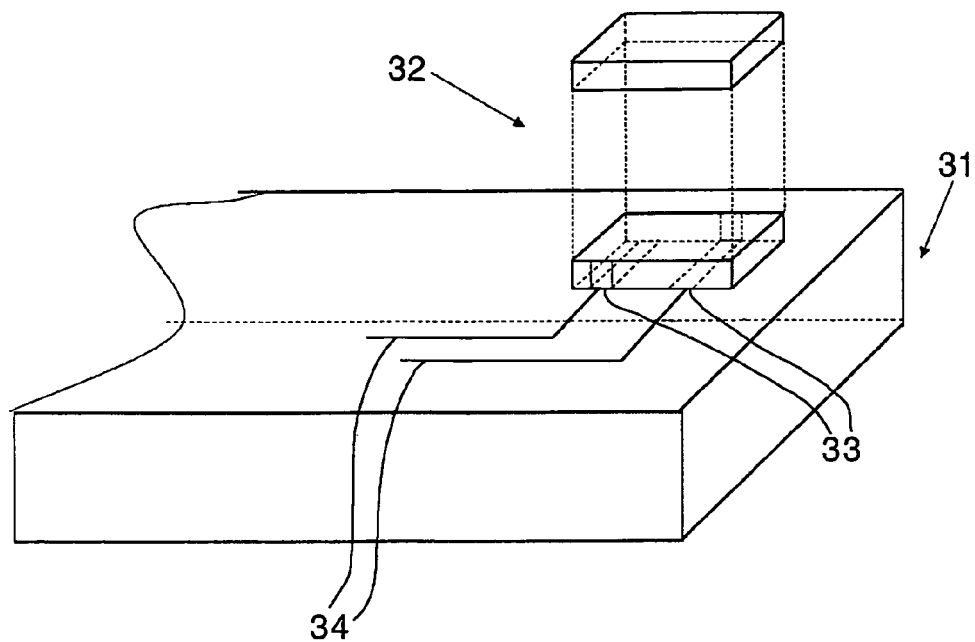
FIG. 15 is a perspective view illustrating board mounted with a magnetic antenna of Example 10.

An IC may be connected to the IC chip connecting terminal 18 formed on an upper surface of the magnetic antenna 32 (see FIG. 14) or may be connected, as shown in FIG. 15, through board wirings 34 connected to board connecting terminals 33 provided on a lower surface of the magnetic antenna 32. Further, for use as RFID tag reader/writer, an IC may be connected to a reader/writer through the board wirings 34 connected to the board connecting terminals 33 provided on a lower surface of the magnetic antenna 32.

EXAMPLES

The following examples are examples in which the present invention is applied to a widely used 13.56 MHz IC card type tag system. First, examples of the magnetic antenna according to the first to third aspects of the present invention (Examples 1 to 6) and comparative examples corresponding thereto (Comparative Examples 1 and 2) will be described.

Example 1

A magnetic antenna of the present invention was produced using an LTCC technology. First, a magnetic layer 15 was prepared. 100 Parts by weight of a calcined Ni—Zn—Cu ferrite powder which had been found to have a magnetic permeability of 100 at 13.56 MHz upon calcination at 900° C. ($Fe_2O_3$: 48.5 mol %, NiO: 25 mol %, ZnO: 16 mol %, CuO: 10.5 mol %), 8 parts by weight of a butyral resin, 5 parts by weight of a plasticizer, and 80 parts by weight of a solvent were mixed in a ball mill to prepare a slurry. The slurry was applied on PET films with a size of 150 mm×150 mm by a doctor blade to such a thickness that the resulting layer thickness after calcination would be 0.1 mm.

Insulating layers 16 were prepared as follows. 100 Parts by weight of a calcined Zn—Cu ferrite powder ($Fe_2O_3$: 48.5 mol %, ZnO: 41 mol %, CuO: 10.5 mol %), 8 parts by weight of a butyral resin, 5 parts by weight of a plasticizer, and 80 parts by weight of a solvent were mixed in a ball mill to prepare a slurry. The slurry was applied on PET films to obtain sheets with the same size and thickness as the sheets for the magnetic layer.

Five green sheets for the magnetic layer 15 were stacked on top of one another as shown in FIG. 1, and through-holes 11 were formed therethrough and filled with an Ag paste. Then, an Ag paste was printed on the surfaces of the laminate perpendicular to the through-holes 11 to form coils 14. The green sheets for the insulating layers 16 were stacked on the upper and lower surfaces of the coils 14 as shown in FIG. 2. A green sheet for another insulating layer 16 having a conductive layer 17 of an Ag paste printed on a surface thereof was stacked on the laminate.

The above green sheets were bonded together by applying a pressure. The resulting laminate was cut along lines passing the through-holes 11 and along coil open ends 13, and calcined at 900° C. for two hours into a unitary body, thereby obtaining a magnetic antenna with a size of 18 mm (length)×4 mm (width) having a 32-turn coil (sample 1) (The coil is shown as having only seven turns and a magnetic layer as being formed of only three layers in FIG. 1 and FIG. 2 for simplification, which applies also other drawings).

An IC for an RFID tag was connected to both ends of the coil of the magnetic antenna, and a capacitor was connected in parallel to the IC. Then, the resonant frequency was adjusted to 13.1 MHz, thereby obtaining an RFID tag. The RFID tag was attached to a metal plate, and its communication distance, the distance over which it was able to communicate with a reader/writer having an output of 10 mW, was measured. Also, the warpage of the magnetic antenna was measured. The measuring methods are described below.
(Methods for Measuring and Adjusting Resonant Frequency)

The resonant frequency was measured by the following method. A one-turn coil was connected to an impedance analyzer (manufactured by Hewlett Packard Company, product name; 4291A), which was in turn coupled to the RFID tag. The peak frequency of the measured impedance was defined as the resonant frequency. The adjustment of the resonant frequency was made by selecting the position of the coil electrodes exposed at ends of the magnetic antenna to adjust the inductance. The resonant frequency can be adjusted by changing the capacity of a capacitor connected in parallel to the IC.
(Methods for Measuring Communication Distance)

The communication distance was measured by the following method. The antenna of a reader/writer having an output of 10 mW (manufactured by FEC Inc., product name; URWI-201) was fixed horizontally, and the RFID tag attached to a metal plate was placed horizontally above the antenna. Then, the RFID tag was moved within a range in which it was able to communicate at 13.56 MHz and the maximum vertical distance between the antenna and the RFID tag was defined as the communication distance.
(Methods for Measuring Warpage)

A dial gage (Mitutoyo Dial Gage ID-C112) having a flat probe was attached to a stand (Mitutoyo Stand BSG-20), and the zero point of the dial gage was adjusted on the surface plate. The magnetic antenna was placed between the surface plate and the flat probe, and the height of the highest point was measured with the dial gage. The thickness of the magnetic antenna measured with a caliper (Mitutoyo caliper CD-C) was subtracted from the height to obtain the warpage.

The resonant frequency, communication distance, and warpage were measured by the above methods. The magnetic antenna had a warpage of 0.6 mm, which is in a permissible range for practical use. The RFID tag using the magnetic antenna showed as small a difference as +1 MHz in the resonant frequency before and after being attached to a metal plate, and the communication distance after being attached to a metal surface was 3 cm.

Example 2

The same green sheets for the magnetic layer 15 as in Example 1, and green sheets comprising a glass ceramic, instead of a Zn—Cu ferrite, for the insulating layers 16 were used. As shown in FIG. 3, five green sheets for the magnetic layer 15 were stacked on top of one another, and through-holes 11 were formed therethrough and filled with an Ag paste. Then, an Ag paste was printed on the surfaces of the laminate perpendicular to the through-holes 11 to form coils 14.

A green sheet for an insulating layer 16 was stacked on one surfaces of the coils 14. At this time, a conductive layer 17 was printed on the insulating layer 16 with an Ag paste. Another insulating layer 16 was stacked on the other surfaces of the coils 14, and through-holes 11 were formed through the other insulating layer 16 in connection with both ends of the coils 14 and filled with an Ag paste. Coil lead terminals 19 and IC chip connecting terminals 18 to which an IC was connectable were printed on the outer surface of the other insulating layer perpendicular to the through-holes 11 with an Ag paste.

The green sheets were bonded together by applying a pressure. The resulting laminate was cut along lines passing the through-holes 11 and along coil open ends 13, and calcined at 900° C. for two hours into a unitary body, thereby obtaining a magnetic antenna with a size of 18 mm (length)×4 mm (width) having a 32-turn coil (sample 2).

An IC for an RFID tag was connected to both ends of the coil of the magnetic antenna, and a capacitor was connected in parallel to the IC just as in Example 1. Then, the resonant frequency was adjusted to 13.1 MHz, thereby obtaining an RFID tag. The RFID tag was attached to a metal plate, and its communication distance, the distance over which it was able to communicate with a reader/writer having an output of 10 mW and its resonant frequency, were measured. The warpage of the magnetic antenna was also measured. The magnetic antenna had a warpage of 1.0 mm, which is in a permissible range for practical use. The RFID tag using the magnetic antenna had a resonant frequency of 14.1 MHz and showed as small a difference as +1 MHz in the resonant frequency before and after being attached to a metal plate. The communication distance after the RFID tag was attached to a metal surface was 3.1 cm.

Example 3

The same green sheets for the magnetic layer 15 and the same green sheets for the insulating layers 16 as in Example 1 were used. As shown in FIG. 4, five green sheets for the magnetic layer 15 were stacked on top of one another, and through-holes 11 were formed therethrough and filled with an Ag paste. Then, an Ag paste was printed on the surfaces of the laminate perpendicular to the through-holes 11 to form coils 14.

A green sheet for an insulating layer 16 was stacked on the lower surfaces of the coils 14. At this time, a conductive layer 17 was printed on the insulating layer 16 with an Ag paste. A green sheet for a magnetic layer 15 was stacked on the lower surface of the insulating layer 16. A green sheet for another insulating layer 16 was stacked on the upper surfaces of the coils 14, and through-holes 11 were formed in the upper surface of the other insulating layer 16 in connection with both ends of the coils 14 and filled with Ag paste. Coil lead terminals 19 and IC chip connecting terminals 18 to which an IC was connectable were printed on the outer surface of the other insulating layer perpendicular to the through-holes 11 with an Ag paste.

The green sheets were bonded together by applying a pressure. The resulting laminate was cut along lines passing the through-holes 11 and along coil open ends 13, and calcined in the same manner as in Example 1, thereby obtaining a magnetic antenna with a size of 18 mm (length)×4 mm (width) having a 32-turn coil (sample 3).

An IC for an RFID tag was connected to the IC chip connecting terminal 18 of the magnetic antenna as in Example 1, and a capacitor was connected in parallel to the IC. Then, the resonant frequency was adjusted to 13.1 MHz, thereby obtaining an RFID tag. The RFID tag was attached to a metal plate, and its communication distance, the distance over which it was able to communicate with a reader/writer having an output of 10 mW, and its resonant frequency were measured. The warpage of the magnetic antenna was also measured. The magnetic antenna had a warpage of 0.8 mm, which is in a permissible range for practical use. The RFID tag using the magnetic antenna showed a difference of +0.5 MHz in the resonant frequency before and after being attached to a metal plate, which was smaller than those in the above Examples. The communication distance after the RFID tag was attached to a metal surface was 3.3 cm.

Example 4

Figure 5:
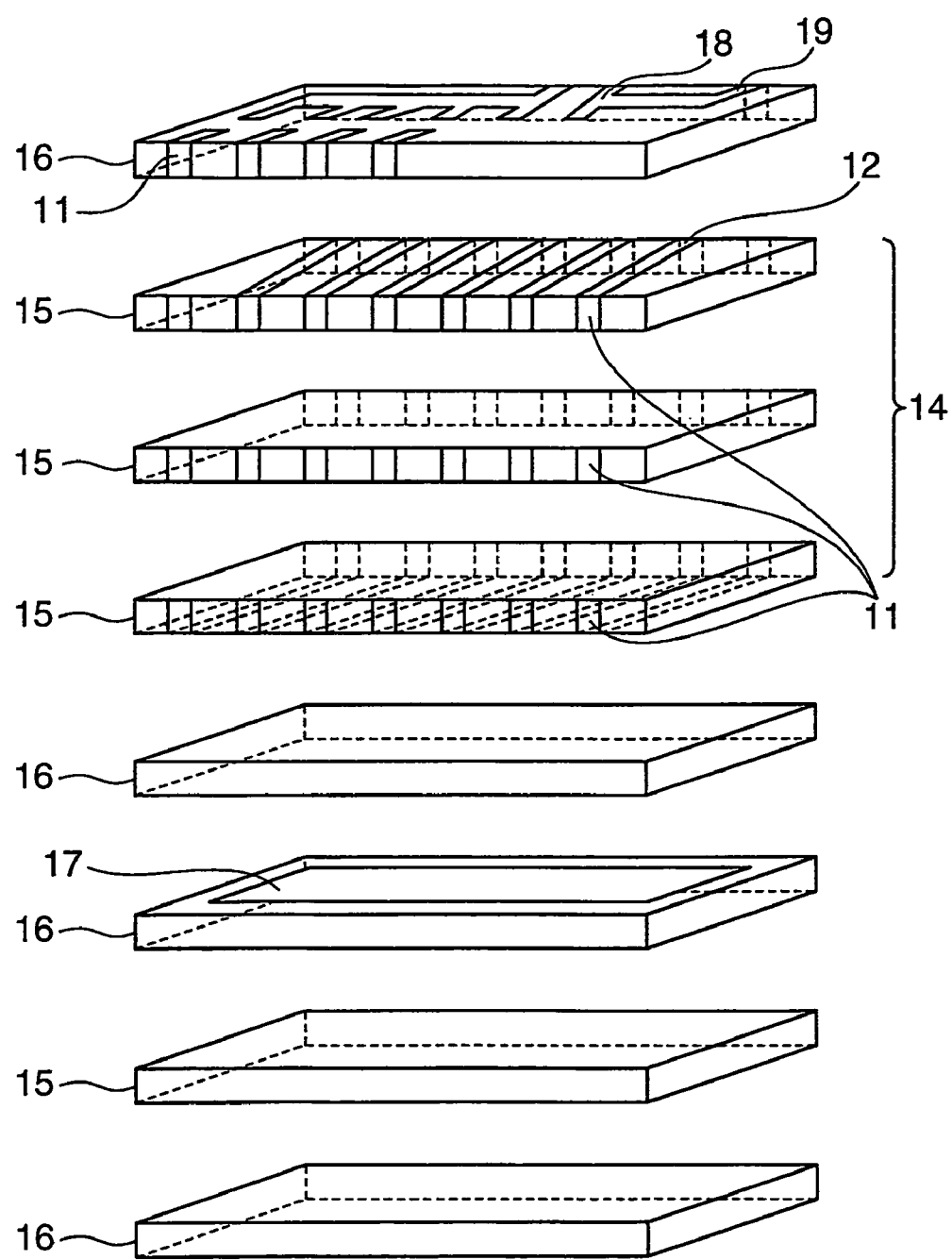
FIG. 5 is a perspective view illustrating a magnetic antenna of Example 4 according to the first to third aspects of the present invention.

The same green sheets for the magnetic layer 15 and the same green sheets for the insulating layers 16 as in Example 1 were used. As shown in FIG. 5, five green sheets for the magnetic layer 15 were stacked on top of one another, and through-holes 11 were formed therethrough and filled with an Ag paste. Then, an Ag paste was printed on the surfaces of the laminate perpendicular to the through-holes 11 to form coils 14.

Two green sheets for insulating layers 16 were stacked on the lower surfaces of the coils 14. At this time, a conductive layer 17 was printed on the lower insulating layer 16 with an Ag paste. A green sheet for a magnetic layer 15 was stacked on the lower surface of the lower insulating layer 16, and a green sheet for another insulating layer 16 was stacked on the lower surface thereof. Through-holes 11 were formed through the insulating layer 16 on the upper surfaces of the coils 14 in connection with one ends of the coils 14 and filled with an Ag paste. Coil lead terminals 19 and a half in number of IC chip connecting terminals 18 to which an IC was connectable were printed on the outer surface of the insulating layer perpendicular to the through-holes 11 with an Ag paste. Through-holes 11 were formed through the insulating layer 16 on the upper surfaces of the coils 14 in connection with one ends and several intermediate points of the coils 14 and filled with an Ag paste. Coil lead terminals 19 and the other half of IC chip connecting terminals 18 to which an IC was connectable were printed with an Ag paste on an outer surface of the insulating layer perpendicular to the through-holes 11. Ends of the coil lead terminals 19 were extended in such a manner that they were opposed to each other.

The green sheets were bonded together by applying a pressure. The resulting laminate was cut along lines passing the through-holes 11 and along coil open ends 13, and calcined at 900° C. for two hours into a unitary body, thereby obtaining a magnetic antenna with a size of 18 mm (length)×4 mm (width) having a 32-turn coil (sample 4).

An IC for an RFID tag was connected to the IC chip connecting terminal 18 of the magnetic antenna as in Example 1. Then, the end faces of the coil lead terminals 19 opposed to each other were short-circuited with a conductive coating or the like, and the inductance was adjusted to adjust the resonant frequency to 13.1 MHz, thereby obtaining an RFID tag. The RFID tag was attached to a metal plate, and its communication distance, the distance over which it was able to communicate with a reader/writer having an output of 10 mw, and its resonant frequency were measured. The warpage of the magnetic antenna was also measured. The magnetic antenna had a warpage of 1.0 mm, which was extremely small. The RFID tag using the magnetic antenna showed as small a difference as +0.5 MHz in the resonant frequency before and after being attached to a metal plate, and the communication distance after being attached to a metal surface was 3.4 cm.

Example 5

The same green sheets for the magnetic layer 15 and the same green sheets for the insulating layers 16 as in Example 1 were used. As shown in FIG. 6, five green sheets for the magnetic layer 15 were stacked together on each other, and through-holes 11 were formed therethrough and filled with an Ag paste. Then, an Ag paste was printed on the surfaces of the laminate perpendicular to the through-holes 11 to form coils 14.

Two green sheets for insulating layers 16 were stacked on the lower surfaces of the coils 14. At this time, a conductive layer 17 was printed on the lower insulating layer 16 with an Ag paste. A green sheet for a magnetic layer 15 was stacked on the lower surface of the lower insulating layer 16. A green sheet for a magnetic layer 15 and a green sheet for an insulating layer 16 were stacked on the upper surfaces of the coils 14. Through-holes 11 were formed through the green sheet for an insulating layer 16 on the upper surfaces of the coils 14 in connection with both ends of the coil 14 and filled with an Ag paste. Capacitor electrodes 1C were printed on an outer surface of the insulating layer perpendicular to the through-holes 11 with an Ag paste. IC chip connecting terminals 18 were printed on the green sheet for another insulating layer 16 on the upper surface of the insulating layer to form capacitors between the IC chip connecting terminals 18 and the capacitor electrodes 1C.

The green sheets were bonded together by applying a pressure. The resulting laminate was cut along lines passing the through-holes 11 and along coil open ends 13, and calcined at 900° C. for two hours into a unitary body, thereby obtaining a magnetic antenna with a size of 18 mm (length)×4 mm (width) having a 32-turn coil (sample 5).

An IC for an RFID tag was connected to the IC chip connecting terminal 18 of the magnetic antenna, and the capacitance was adjusted by cutting off a part of the IC chip connecting terminal 18 to adjust the resonant frequency to 13.1 MHz, thereby obtaining an RFID tag. The RFID tag was attached to a metal plate, and its communication distance, the distance over which it was able to communicate with a reader/writer having an output of 10 mW, and its resonant frequency were measured. The warpage of the magnetic antenna was also measured. The magnetic antenna had a warpage of 0.1 mm, which was extremely small. The RFID tag using the magnetic antenna showed as small a difference as +0.5 MHz in the resonant frequency before and after being attached to a metal plate, and the communication distance after being attached to a metal surface was 3.3 cm.

Example 6

Green sheets for a magnetic layer 15 were prepared. 100 Parts by weight of a calcined Ni—Zn—Cu ferrite powder which had been found to have a magnetic permeability of 20 at 100 MHz upon calcination at 900° C. ($Fe_2O_3$: 48.5 mol %, NiO: 39 mol %, ZnO: 2 mol %, CuO: 10.5 mol %), 7 parts by weight of a butyral resin, 3 parts by weight of a plasticizer, 100 parts by weight of a solvent were mixed in a ball mill to prepare a slurry. The slurry was applied on PET films with a doctor blade.

Green sheets for an insulating layer 16 were prepared. 100 Parts by weight of a calcined Zn—Cu ferrite powder ($Fe_2O_3$: 48.5 mol %, ZnO: 40 mol %, CuO: 11.5 mol %), 7 parts by weight of a butyral resin, 3 parts by weight of a plasticizer, 100 parts by weight of a solvent were mixed in a ball mill to prepare a slurry, and the slurry was applied on PET films with a doctor blade.

Figure 7:
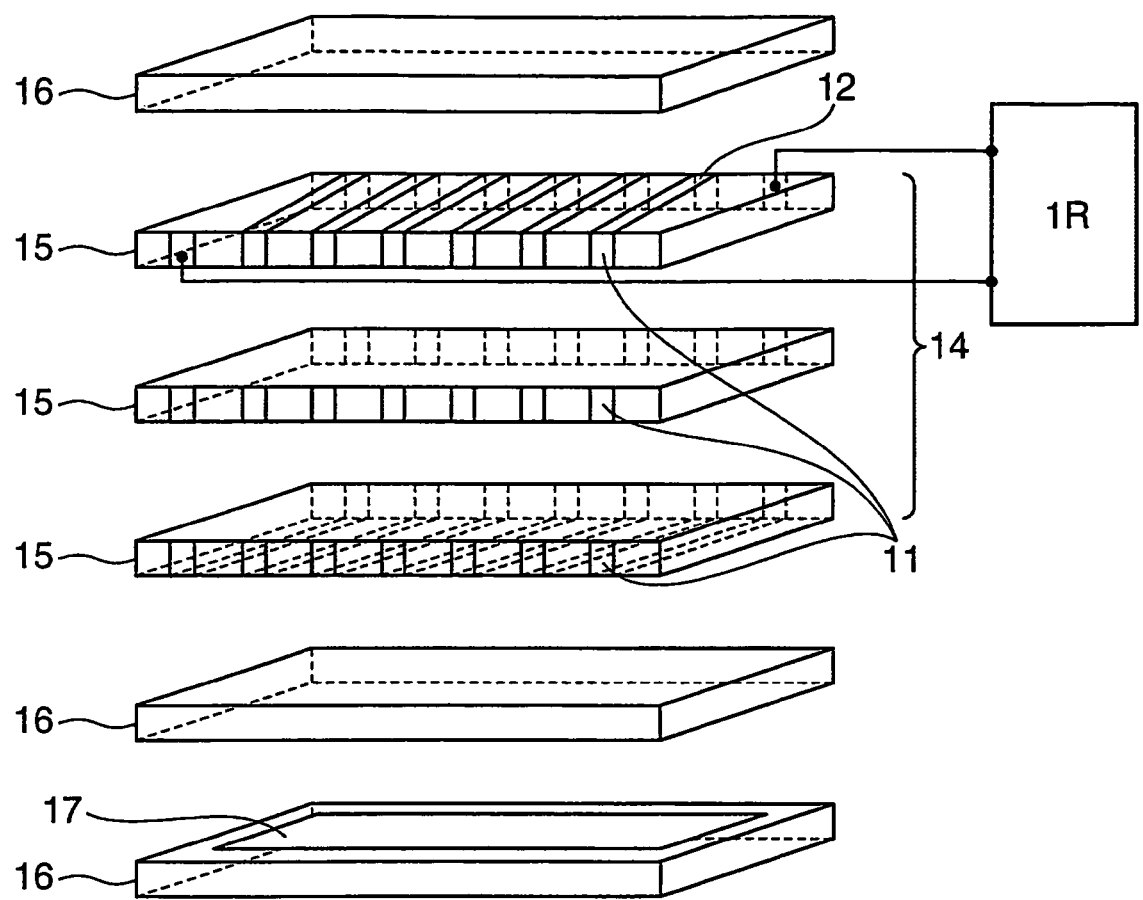
FIG. 7 is a perspective view illustrating a magnetic antenna of Example 6 according to the first to third aspects of the present invention.

As shown in FIG. 7, five green sheets for the magnetic layer 15 were stacked together on each other, and through-holes 11 were formed therethrough and filled with an Ag paste. An Ag paste was printed on the surfaces of the laminate perpendicular to the through-holes 11 to form coils 14. The green sheets for the insulating layers 16 were stacked on the upper and lower surfaces of the coils 14, and another insulating layer 16 having a conductive layer 17 of an Ag paste printed thereon was stacked on the insulating layer 16 on the lower surfaces of the coils 14.

The green sheets were bonded together by applying a pressure. The resulting laminate was cut along lines passing the through-holes 11 and along coil open ends 13, and calcined at 900° C. for two hours into a unitary body, thereby obtaining a magnetic antenna with a size of 18 mm (length)×4 mm (width) having a 50-turn coil (sample 6).

An FM radio 1R was connected to both ends of the coil of the magnetic antenna, and a capacitor was connected in parallel to the coil 14. The resonant frequency was adjusted to 82 MHz, thereby obtaining an FM broadcast receiving antenna. This is intended for use as an antenna on a metallic case of a cellular phone or the like. When the magnetic antenna was attached to a metal plate and used to receive an FM broadcast (82 MHz), good reception was achieved. When the warpage of the magnetic antenna was measured, the warpage was as small as 0.6 mm.

Comparative Example 1

Figure 8:
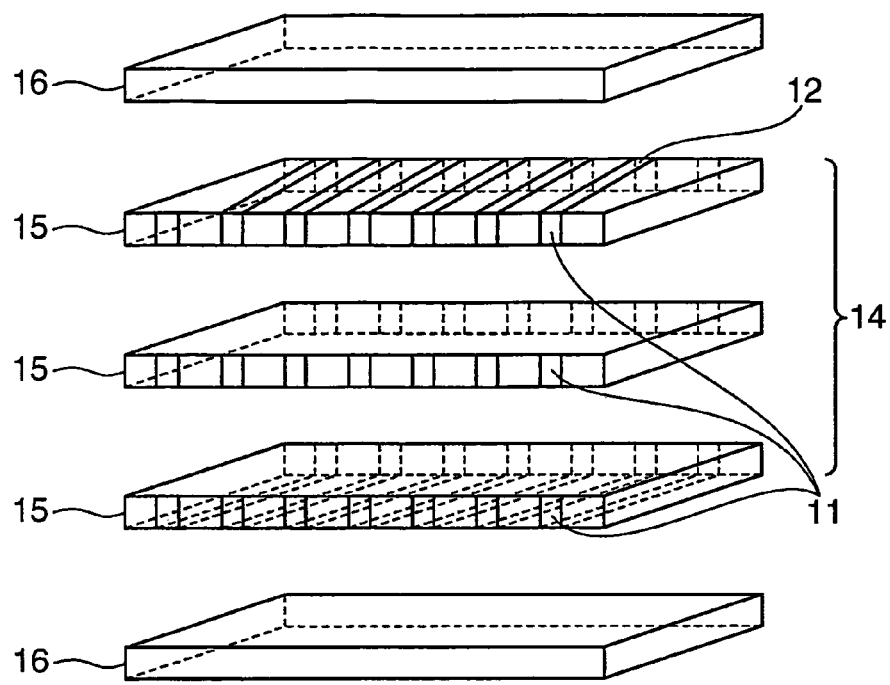
FIG. 8 is a perspective view of a laminated magnetic antenna having no conductive layer as Comparative Example 1.

A magnetic antenna (sample 7), which was the same as the magnetic antenna of Example 1 except for not having a conductive layer 17 as shown in FIG. 8, was produced. An IC for an RFID tag was connected to both ends of the coil of the magnetic antenna, and a capacitor was connected in parallel to the IC as in Example 1. The resonant frequency was adjusted to 13.1 MHz, thereby obtaining an RFID tag. The RFID tag was attached to a metal plate, and the communication distance, resonant frequency, and warpage of the magnetic antenna were measured in the same manner as in Example 1. The magnetic antenna had a warpage of 1.0 mm. The RFID tag using the magnetic antenna showed as large a difference as +1.5 MHz in the resonant frequency before and after being attached to a metal plate, and the communication distance after being attached to a metal surface was only 1.4 cm.

Comparative Example 2

For the purpose of comparison, a commercially available IC card type tag (manufactured by Texas Instruments, product name; Tag-it™ HF) having an antenna coil formed on surfaces of a resin film in a spiral pattern and an IC connected to both ends of the antenna coil was attached to a metal plate and its communication distance was measured in the same manner as in Example 1. The communication distance after being attached to a metal plate was 0.1 cm, and no resonant frequency was observed after being attached to a metal plate.

The results of measurement in the above Examples and Comparative Examples are summarized and shown in Table 1 below.

TABLE 1

| Examples and Comparative Examples | Magnetic antenna (sample) | Resonant frequency | |
|---|---|---|---|
| | | Before attached to metal plate (MHz) | After attached to metal plate (MHz) |
| Example 1 | 1 | 13.1 | 14.1 |
| Example 2 | 2 | 13.1 | 14.1 |
| Example 3 | 3 | 13.1 | 13.6 |
| Example 4 | 4 | 13.1 | 13.6 |
| Example 5 | 5 | 13.1 | 13.6 |
| Comparative Example 1 | 7 | 13.1 | 14.6 |
| Comparative Example 2 | card type | 13.2 | — |

| Example and Comparative Example | Communication distance | | Warpage (mm) |
|---|---|---|---|
| | Before attached to metal plate (cm) | After attached to metal plate (cm) | |
| Example 1 | 3 | 3 | 0.6 |
| Example 2 | 3 | 3.1 | 1 |
| Example 3 | 3.1 | 3.3 | 0.8 |

TABLE 1-continued

| Example 4 | 3.1 | 3.4 | 0.1 |
| Example 5 | 3.1 | 3.3 | 0.1 |
| Comparative Example 1 | 3.1 | 1.4 | 0.1 |
| Comparative Example 2 | — | 0.1 | — |

Examples of the magnetic antenna according to fourth to seventh aspects of the present invention (Examples 7 and 8) and comparative examples corresponding thereto (Comparative Examples 3 and 4) will be next described.

Example 7

A magnetic antenna of the present invention was produced using an LTCC technology. First, a magnetic layer 21 was prepared. A calcined ferrite powder, a butyral resin, a plasticizer, and a solvent were mixed in a ball mill to prepare a slurry and the slurry was shaped into sheets in the same manner as in Example 1. Also, insulating layers 23 were prepared in the same manner as in Example 1. That is, a calcined Zn—Cu ferrite powder, a butyral resin, a plasticizer, a solvent were mixed in a ball mill to prepare a slurry and the slurry was shaped into sheets in the same manner as in Example 1.

Five green sheets for the magnetic layer 21 were stacked together on each other, and through-holes were formed therethrough and filled with an Ag paste. An Ag paste was printed on surfaces of two of the green sheets perpendicular to the through-holes to form coil electrodes 22. Then, the five green sheets were punched along lines passing the centers of the through-holes to form coil assemblies each having three coils arranged radially with their magnetic layers connected at the center of the radial pattern. Then, the five green sheets were stacked in such a manner that the two green sheets having a coil electrode printed thereon were placed on both sides of the other three green sheets to form three-pole coils. A green sheet as an insulating layer 23 punched in the same pattern as the magnetic layer and having a conductive layer 24 of an Ag paste printed thereon was stacked on the lower surfaces of the coil assemblies in such a manner that the conductive layer 24 was located outside.

The above green sheets were bonded together by applying a pressure. The resulting laminate was cut into individual pieces of coil assemblies, and each piece of coil assembly was calcined at 900° C. for two hours into a unitary body, thereby obtaining a magnetic antenna having coils each having a length of 20 mm and 10 turns (sample 8). FIG. 9 shows a schematic view of the obtained magnetic antenna. In the drawing, the number of turns of the coils is shown in a simplified manner.

An RFID tag reader/writer was connected to both ends of the coil of the magnetic antenna, and a capacitor was connected in parallel to the reader/writer. The resonant frequency was adjusted to 13.56 MHz. The magnetic antenna was attached to a metal plate, and its communication distance, the distance over which it was able to communicate with an RFID tag, was measured. The methods for measuring and adjusting the resonant frequency, and the method for measuring the communication distance are described below.

(Methods for Measuring and Adjusting Resonant Frequency)

The resonant frequency was measured by the following method. A one-turn coil is connected to an impedance analyzer (manufactured by Hewlett Packard Company, product name; 4291A), which was in turn coupled to the RFID tag reader/writer. The peak frequency of the measured impedance was defined as the resonant frequency. The adjustment of the resonant frequency was made by changing the capacity of a capacitor connected in parallel or series thereto.

(Method for Measuring Communication Distance)

The communication distance was measured by the following method. The standard antenna of a reader/writer having an output of 100 mw (manufactured by Takaya Corporation, product name; D002A) was removed, and the magnetic antenna of the present invention was connected thereto and fixed horizontally. An RFID tag (IC card type tag, manufactured by Texas Instruments, product name; Tag-it™ HF) was placed horizontally above the magnetic antenna. Then, the RFID tag was moved within a range in which it was able to communicate at 13.56 MHz and the maximum vertical distance between the antenna and the RFID tag was defined as the communication distance.

As a result of measuring the resonant frequency and communication distance by the above methods, the reader/writer using the magnetic antenna showed as small a difference as +1 MHz in the resonant frequency before and after being attached to a metal plate, and the communication distance after being attached to a metal surface was 3 cm.

Example 8

The same green sheets for a magnetic layer 21 as in Example 7, and green sheets comprising a glass ceramic, instead of a Zn—Cu ferrite, for the insulating layers 23 were used. Five green sheets for the magnetic layer 21 were stacked on top of one another, and through-holes were formed therethrough and filled with an Ag paste. An Ag paste was printed on surfaces of two of the green sheets perpendicular to the through-holes to form coil electrodes 22.

Then, the five green sheets were punched along lines passing the centers of the through-holes to form coil assemblies each having three coils arranged radially with their magnetic layers connected to an annular portion surrounding them. Then, the five green sheets were stacked in such a manner that the two green sheets having a coil electrode printed thereon were placed on both sides of the other three green sheets to form a three-pole coil. A green sheet as an insulating layer 23 having a conductive layer 24 of an Ag paste printed thereon and having a circular shape was stacked on the lower surface of the coil to cover the entire lower surface thereof in such a manner that the conductive layer 24 was located outside, and a green sheet as another magnetic layer 25 was stacked on the lower surface of the conductive layer 24.

The above green sheets were bonded together by applying a pressure. The resulting laminate was cut into individual pieces of coil assemblies, and each piece of coil assembly was calcined at 900° C. for two hours into a unitary body, thereby obtaining a magnetic antenna having a diameter of 10 mm and having seven turn coils (sample 9). FIG. 10 shows a schematic view of the obtained magnetic antenna. In the drawing, the number of turns of the coils is shown in a simplified manner.

An RFID tag reader/writer was connected to both ends of the coil of the magnetic antenna, and a capacitor was connected in parallel or series to the reader/writer. The resonant frequency was adjusted to 13.56 MHz. The change in the resonant frequency and its communication distance, the distance over which it was able to communicate with an RFID tag when attached to a metal plate, were measured in the same manner as in Example 7. The reader/writer using the magnetic antenna showed as small a difference as +0.5 MHz in the resonant frequency before and after being attached to a metal plate, and the communication distance after being attached to a metal surface was 3.4 cm.

Comparative Example 3

A magnetic antenna (sample 10), which was the same as the magnetic antenna of Example 7 except for not having the conductive layer 24 shown in FIG. 9, was produced. An RFID tag reader/writer was connected to both ends of the coil of the magnetic antenna, and a capacitor was connected in parallel or series to the reader/writer. The resonant frequency was adjusted to 13.56 MHz. The change in the resonant frequency and the communication distance of the magnetic antenna, the distance over which it was able to communicate with an RFID tag when attached to a metal plate, were measured in the same manner as in Example 7. The reader/writer using the magnetic antenna showed a difference of +2.3 MHz in the resonant frequency before and after being attached to a metal plate, and the communication distance after being attached to a metal surface was 1.6 cm.

Comparative Example 4

For the purpose of comparison, a commercially available antenna for a reader/writer having a coil formed on surfaces of a resin film in a spiral pattern was attached to a metal plate and its communication distance, the distance over which it was able to communicate with an RFID tag, was measured. The antenna has a size of 30 mm×55 mm, and the coil has three turns. The communication distance after being attached to a metal plate was 0.5 cm.

Description will be next made of Examples (Examples 9 and 10) of a board in accordance with the eighth aspect of the present invention having a mounted magnetic antenna, and Comparative Example (Comparative Example 5) thereof.

Example 9

When the obtained magnetic antenna obtained from Example 1 was mounted on a surface of a multilayer wiring board 31 with an adhesive agent, the difference in the resonant frequency before and after mounting was as small as +0.9 MHz and a communication distance of 3.2 cm was obtained in the state where the antenna was mounted on the multilayer wiring board.

Comparative Example 5

A board mounted with a magnetic antenna was obtained in the same manner as described in Example 9 except for using Sample 7 as the magnetic antenna. The difference in the resonant frequency before and after mounting on the board was as large as +1.4 MHz and the communication distance was 1.7 cm in the state where the antenna was mounted on the multilayer wiring board.

Example 10

In the same manner as in the magnetic antenna (Sample 1), green sheets for a magnetic layer 15 and green sheets for insulating layers 16 were prepared. As shown in FIG. 14, through-holes 11 were formed in the green sheets for the magnetic layer 15 and filled with an Ag paste. Further, an Ag paste was printed on both surfaces perpendicular to the through-holes 11. Five green sheets were laminated to form coils 14.

Next, through-holes 11 were formed through the green sheet for the insulating layer 16 on the lower surface of the coils 14 in connection with both ends of the coils 14 and filled with an electrode material. Further, on the lower surface of the resulting insulating layer was laminated a green sheet for the insulating layer 16 which had been provided with through holes 11 filled with the conductive material and which had been printed with a conductive layer 17. Furthermore, on the lower surface of the resulting insulating layer was laminated a green sheet for the magnetic layer 15 which had been provided with through holes 11 filled with the conductive material and which had been printed with board connecting terminals 33.

Through-holes 11 were formed through the green sheet for the insulating layer 16 on the upper surfaces of the coils 14 in connection with both ends of the coils 14 and filled with an Ag paste. Further, coil lead terminals 19 and IC chip connecting terminals 18 to which an IC was connectable were printed on an outer surface of the insulating layer perpendicular to the through-holes 11.

The above green sheets were bonded together by applying a pressure. The resulting laminate was cut along lines passing the through-holes 11 and along coil open ends, and each of the cut products was calcined at 900° C. for two hours into a unitary body, thereby obtaining a magnetic antenna 32 with a size of 18 mm (length)–4 mm (width) having a 32-turn coil.

The board connecting terminals 33 of the magnetic antenna 32 were connected by reflow soldering to a multilayer wiring board 31 made of a resin, so that the antenna was connected to an IC through board wirings 34 within the multilayer wiring board 31, thereby obtaining an IC tag. This was measured for communication distance with a reader/writer having an output of 10 mW.

As a result, it was found that the RFID tag showed a difference in the resonant frequency before and after mounting on the multilayer wiring board 31 of as small as +0.5 MHz and a communication distance of 3.2 cm in the state where the tag was mounted on the multilayer wiring board 31.

The results of the measurement in the above Examples 9 and 10 and Comparative Example 5 were summarized in Table below.

TABLE 2

| | Magnetic antenna (sample) | Method of connecting to substrate |
|---|---|---|
| Example 9 | 1 | Adhesive agent |
| Example 10 | — | Soldering |
| Comparative Example 5 | 7 | Adhesive agent |

| | Resonant frequency | | Communication distance | |
|---|---|---|---|---|
| | Before | After | Before | After |
| | attached to metal plate (MHz) | attached to metal plate (MHz) | attached to metal plate (cm) | attached to metal plate (cm) |
| Example 9 | 13.1 | 14.0 | 3.0 | 3.2 |
| Example 10 | 13.1 | 13.6 | 3.1 | 3.5 |
| Comparative Example 5 | 13.1 | 14.5 | 3.1 | 1.7 |

The invention claimed is:

1. A magnetic antenna for transmitting and receiving a magnetic field component, comprising:
a plurality of coils each comprising a magnetic layer having a square or rectangular planar shape and arranged radially at generally angularly equal intervals as viewed in a plan view with their one ends connected in series or parallel to one another at the center of the radial pattern by the magnetic layers thereof such that said coils have the same polarity, said plurality of coils extending radially outward and opening in a magnetic circuit at the other ends;

an insulating layer provided on one or both outer surfaces of said coils; and a conductive layer provided on an outer surface of at least one of said insulating layers, and further comprising an additional magnetic layer provided on an outer surface of said conductive layer.

2. A magnetic antenna according to claim 1, wherein said method further comprises forming through-holes in said insulating layer opposite the one on which said conductive layer has been formed, filling said through-holes with an electrode material so that the filled electrode material in said through-holes is connected to opposite ends of said coils, and printing coil lead terminals of an electrode material on said insulating layer.

3. A magnetic antenna according to claim 1, further comprising an additional insulating layer provided on an outer surface of said additional magnetic layer.

4. A magnetic antenna according to claim 1, wherein said magnetic layer comprises an Ni—Zn based ferrite.

5. A magnetic antenna according to claim 1, wherein said insulating layers comprises a Zn based ferrite.

6. A magnetic antenna according to claim 1, wherein said insulating layers comprises a glass based ceramic.

7. A magnetic antenna according to claim 1, further comprising a terminal on an upper surface thereof to which an IC chip is connectable, wherein said terminal is connected in parallel or series to said coil lead terminals.

8. A board mounted with the magnetic antenna as defined in claim 1.

9. A board mounted with the magnetic antenna as defined in claim 3.

10. A magnetic antenna for transmitting and receiving a magnetic field component, comprising:

a plurality of coils each comprising a magnetic layer having a square or rectangular planar shape and arranged radially at generally angularly equal intervals as viewed in a plan view with their one ends connected in series or parallel to one another at the center of the radial pattern by the magnetic layers thereof such that said coils have the same polarity, said plurality of coils extending radially outward and opening in a magnetic circuit at the other ends;

an insulating layer provided on one or both outer surfaces of said coils; and a conductive layer provided on an outer surface of at least one of said insulating layers, and further comprising an additional insulating layer having square or circular electrodes printed on both sides thereof on said additional insulating layer and provided on an upper surface of insulating layers covering said coil to form a capacitor, wherein said electrodes of said capacitor are connected in parallel or series to said coil lead terminal electrodes.

11. A board mounted with the magnetic antenna as defined in claim 10.

12. A magnetic antenna for transmitting and receiving a magnetic field component, comprising:

a plurality of coils each comprising a magnetic layer having a square or rectangular planar shape and arranged radially at generally angularly equal intervals as viewed in a plan view with their one ends connected in series or parallel to one another at the center of the radial pattern by the magnetic layers thereof such that said coils have the same polarity, said plurality of coils extending radially outward and opening in a magnetic circuit at the other ends;

an insulating layer provided on one or both outer surfaces of said coils; and a conductive layer provided on an outer surface of at least one of said insulating layers, and further comprising a parallel electrode or an interdigital electrode printed on an upper surface of said insulating layer on the upper surface of said coil assembly to form a capacitor, and said capacitor is connected in parallel or series to said coil lead terminals.

13. A board mounted with the magnetic antenna as defined in claim 12.

14. A magnetic antenna for transmitting and receiving magnetic field component, comprising:

a coil comprising a magnetic layer and an electrode material formed in a spiral configuration around said magnetic layer;

a first insulating layer provided on one or both outer surfaces of said coil;

a second insulating layer provided on an outer surface of said first insulating layer;

a conductive layer provided between said first and said second insulating layers; and an additional magnetic layer provided on an outer surface of said second insulating layer.

15. A magnetic antenna according to claim 14, wherein said first insulating layer is provided on both outer surfaces of said coil, a capacitor electrode is provided on one said first insulating layer contacting on said conductive layer, said first insulating layer contacting on said conductive layer has an electrode printed on an outer surface thereof so that a capacitor is formed between said capacitor electrode and said electrode, wherein said capacitor is connected in parallel or series to said IC chip connecting terminal.

16. A magnetic antenna according to claim 14, further comprising a parallel electrode or interdigital electrode printed on a surface of one of said insulating layers to form a capacitor, wherein said capacitor is connected in parallel or series to said coil lead terminal.

17. A magnetic antenna according to claim 14, wherein said magnetic layer comprises an Ni—Zn based ferrite.

18. A magnetic antenna according to claim 14, wherein said insulating layers comprise a Zn based ferrite.

19. A magnetic antenna according to claim 14, wherein said insulating layers comprise a glass based ceramic.

20. A magnetic antenna according to claim 14, further comprising a terminal to which said IC chip is connectable on an upper surface of one of said insulating layers, wherein said terminal is connected in parallel or series to said coil lead terminal.

21. A magnetic antenna according to claim 14, further comprising a terminal to which a variable capacitor is connectable, wherein said terminal is connected in parallel or series to said coil lead terminal.

22. A board mounted with the magnetic antenna as defined in claim 14.

23. A magnetic antenna for transmitting and receiving magnetic field component, comprising:

a coil comprising a magnetic layer and an electrode material formed in a spiral configuration around said magnetic layer;

a first insulating layer provided on one or both outer surfaces of said coil;

a conductive layer on said insulating layer;

an additional magnetic layer provided on an outer surface of said conductive layer, and a second insulating layer provided on an outer surface of said magnetic layer.

24. A magnetic antenna for transmitting and receiving magnetic field component, comprising:

a coil comprising a magnetic layer and an electrode material formed in a spiral configuration around said magnetic layer;

a first insulating layer provided on one or both outer surfaces of said coil;

a second insulating layer provided on an outer surface of said first insulating layer;

a conductive layer provided between said first and said second insulating layers;

an additional magnetic layer provided on an outer surface of said second insulating layer, and a third insulating layer provided on an outer surface of said additional magnetic layer.

* * * * *